(12) United States Patent
Takei

(10) Patent No.: US 12,444,704 B2
(45) Date of Patent: Oct. 14, 2025

(54) SEMICONDUCTOR DEVICE AND METHOD OF MANUFACTURING THE SEMICONDUCTOR DEVICE

(71) Applicant: ROHM CO., LTD., Kyoto (JP)

(72) Inventor: Shoji Takei, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 541 days.

(21) Appl. No.: 17/749,076

(22) Filed: May 19, 2022

(65) Prior Publication Data

US 2022/0399292 A1    Dec. 15, 2022

(30) Foreign Application Priority Data

Jun. 14, 2021  (JP) ................................. 2021-098730

(51) Int. Cl.
    *H01L 23/00*    (2006.01)
(52) U.S. Cl.
    CPC .............. *H01L 24/05* (2013.01); *H01L 24/03* (2013.01); *H01L 2224/03614* (2013.01);
    (Continued)
(58) Field of Classification Search
    CPC ...................... H01L 24/05; H01L 24/03; H01L 2224/03614; H01L 2224/0362; H01L 2224/03622; H01L 2224/04042; H01L 2224/05015; H01L 2224/05025; H01L 2224/05082; H01L 2224/05147; H01L 2224/05155; H01L 2224/05164; H01L 2224/05565; H01L 2224/0569; H01L 2924/066; H01L 2924/07025;
    (Continued)

(56) References Cited

U.S. PATENT DOCUMENTS

2018/0090461 A1*  3/2018  Tanaka ................ H01L 23/3114

FOREIGN PATENT DOCUMENTS

| JP | 2010171386 A | 8/2010 |
| JP | 2018061018 A | 4/2018 |

OTHER PUBLICATIONS

Japanese Office Action dated Mar. 6, 2025, in the counterpart Japanese Patent Application No. 2021-098730.
(Continued)

*Primary Examiner* — Fernando L Toledo
*Assistant Examiner* — Shawn Shaw Muslim
(74) *Attorney, Agent, or Firm* — Rabin & Berdo, P.C.

(57) ABSTRACT

A semiconductor device includes: a semiconductor chip having an element forming surface; an insulating layer formed on the element forming surface; a pad wiring layer including a first conductive layer formed on the insulating layer and containing a first conductive material and a second conductive layer formed on the first conductive layer and containing a second conductive material different from the first conductive material, wherein the second conductive layer includes an eaves portion protruding outward with respect to an end surface of the first conductive layer; a bonding member bonded to the pad wiring layer and supplying electric power to an element of the element forming surface; and a coating insulating film selectively formed on the insulating layer below the eaves portion, exposing an upper surface of the insulating layer to a peripheral region of the pad wiring layer, and covering the end surface of the first conductive layer.

16 Claims, 38 Drawing Sheets

(52) U.S. Cl.
CPC ............... *H01L 2224/0362* (2013.01); *H01L 2224/03622* (2013.01); *H01L 2224/04042* (2013.01); *H01L 2224/05015* (2013.01); *H01L 2224/05025* (2013.01); *H01L 2224/05082* (2013.01); *H01L 2224/05147* (2013.01); *H01L 2224/05155* (2013.01); *H01L 2224/05164* (2013.01); *H01L 2224/05565* (2013.01); *H01L 2224/0569* (2013.01); *H01L 2924/066* (2013.01); *H01L 2924/07025* (2013.01); *H01L 2924/351* (2013.01)

(58) Field of Classification Search
CPC ......... H01L 2924/351; H01L 23/49548; H01L 23/4951; H01L 23/49562; H01L 24/16; H01L 2224/0401; H01L 24/48; H01L 2224/17106; H01L 2924/00014; H01L 24/13; H01L 2224/48463; H01L 2924/181; H01L 24/11; H01L 24/17; H01L 2224/16245

See application file for complete search history.

(56) References Cited

OTHER PUBLICATIONS

Final Rejection issued by the Japan Patent Office for the JP counterpart application JP 2021-098730 on Jul. 31, 2025.

* cited by examiner

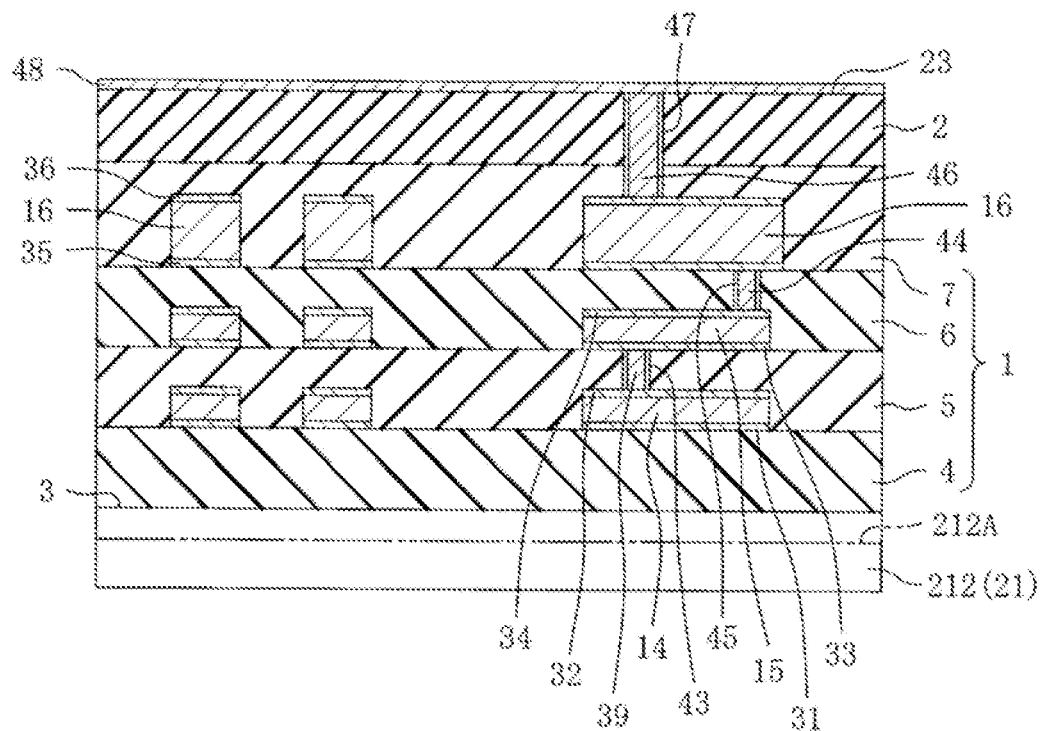

SEMICONDUCTOR DEVICE AND METHOD OF MANUFACTURING THE SEMICONDUCTOR DEVICE

CROSS-REFERENCE TO RELATED APPLICATION

This application is based upon and claims the benefit of priority from Japanese Patent Application No. 2021-098730, filed on Jun. 14, 2021, the entire contents of which are incorporated herein by reference.

TECHNICAL FIELD

The present disclosure relates to a semiconductor device and a method of manufacturing the semiconductor device.

BACKGROUND

In the related art, there is disclosed a semiconductor device that includes a semiconductor substrate, a Cu wiring formed on the semiconductor substrate, a plating layer covering a front surface and a side surface of the Cu wiring, and a Cu wire wire-bonded on the Cu wiring via the plating layer. The plating layer has a laminated structure of Ni/Pd/Au. A manufacturing process of this semiconductor device includes, for example, a step of forming the Cu wiring on an insulating film covering the semiconductor substrate via a barrier metal film. Each barrier metal film includes a Ti/Cu seed layer formed by a sputtering method. The Cu wiring is formed on the barrier metal film by an electrolytic plating method using a resist film on the barrier metal film as a mask. After plating the Cu wiring, the resist film is removed, and the exposed Ti/Cu seed layer is removed by wet etching. For example, the Cu seed layer is first removed with a mixed solution of hydrogen peroxide water and nitric acid, and then the Ti film is removed with a mixed solution of hydrogen peroxide water and ammonia.

SUMMARY

Some embodiments of the present disclosure provide a semiconductor device capable of suppressing ion migration in the peripheral region of a pad wiring layer and reducing stress on the pad wiring layer.

According to an embodiment of the present disclosure, there is provided a semiconductor device including: a semiconductor chip having an element forming surface; an insulating layer formed on the element forming surface of the semiconductor chip; a pad wiring layer including a first conductive layer formed on the insulating layer and containing a first conductive material and a second conductive layer formed on the first conductive layer and containing a second conductive material different from the first conductive material, wherein the second conductive layer includes an eaves portion protruding outward with respect to an end surface of the first conductive layer; a bonding member that is bonded to the pad wiring layer and supplies electric power to an element of the element forming surface; and a coating insulating film that is selectively formed on the insulating layer below the eaves portion, exposes an upper surface of the insulating layer to a peripheral region of the pad wiring layer, and covers the end surface of the first conductive layer.

BRIEF DESCRIPTION OF DRAWINGS

FIG. 23A is a view for explaining a part of a process of manufacturing the semiconductor device.

DETAILED DESCRIPTION

Embodiments of the present disclosure will now be described in detail with reference to the accompanying drawings. In the following detailed description, there are a plurality of constituent elements having names with numerals, but these numerals do not necessarily match the numerals of the constituent elements set forth in the claims. A semiconductor device A10 according to a first embodiment of the present disclosure will be described with reference to FIGS. 1 to 16.

Figure 1:
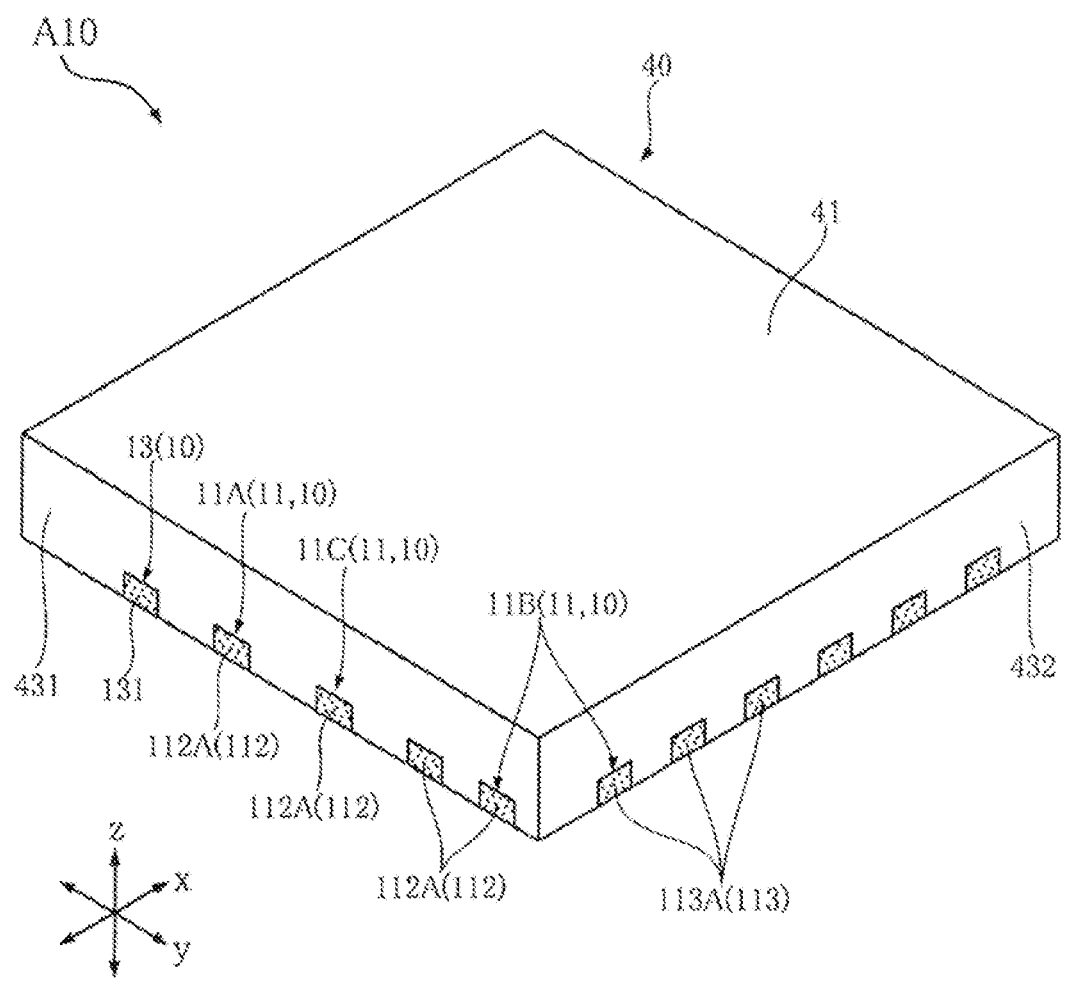
FIG. 1 is a perspective view of a semiconductor device according to a first embodiment of the present disclosure.

The semiconductor device A10 includes a conductive member 10, an element chip 20, a bonding layer 30, and a sealing resin 40. As shown in FIG. 1, the package format of the semiconductor device A10 is QFN (Quad For Non-Lead Package). The element chip 20 is a flip-chip type LSI. The element chip 20 includes a switching circuit 212A and a control circuit 212B (details of which will be described later) therein.

Figure 2:
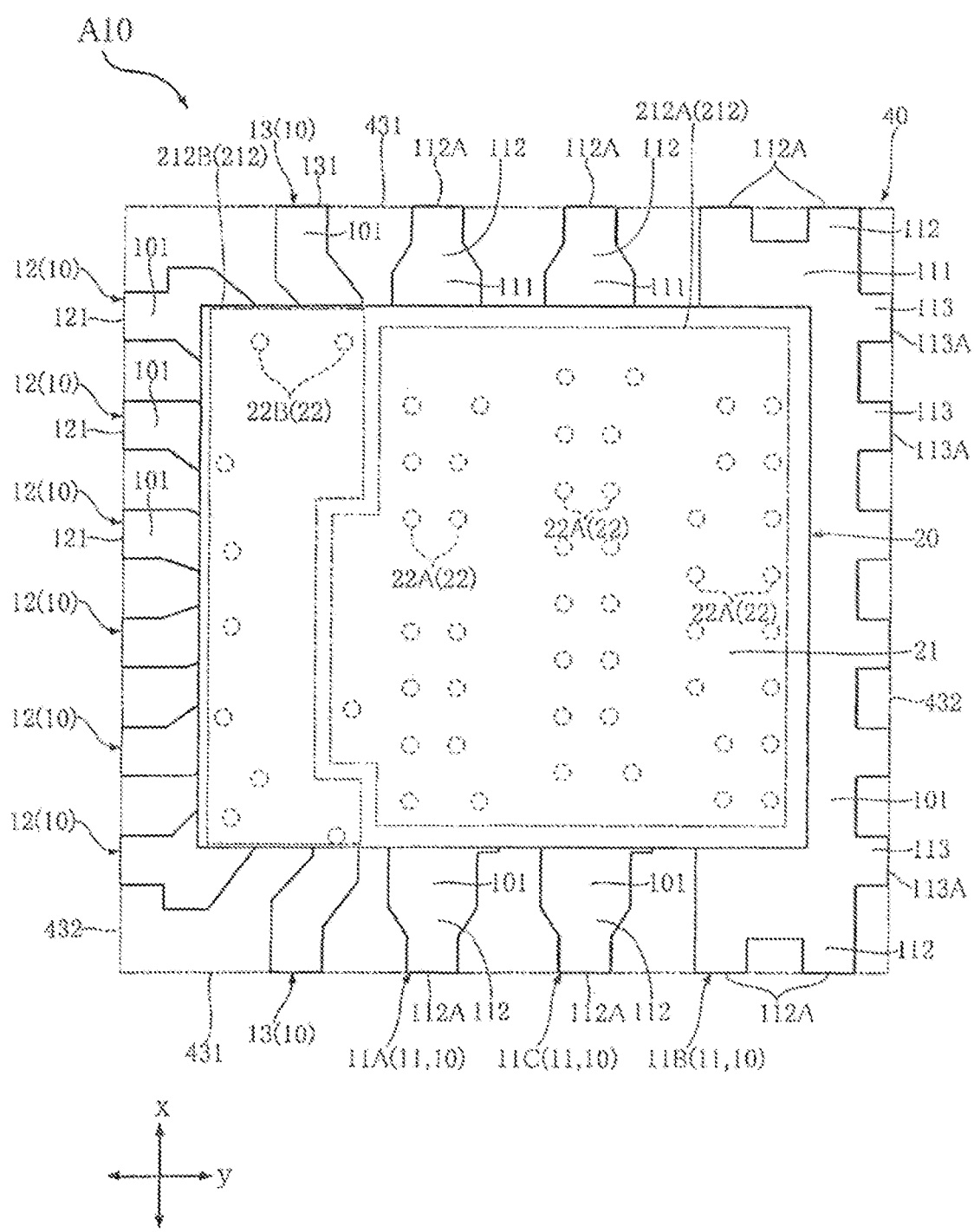
FIG. 2 is a plan view (transparent to a sealing resin) of the semiconductor device shown in FIG. 1.
Figure 3:
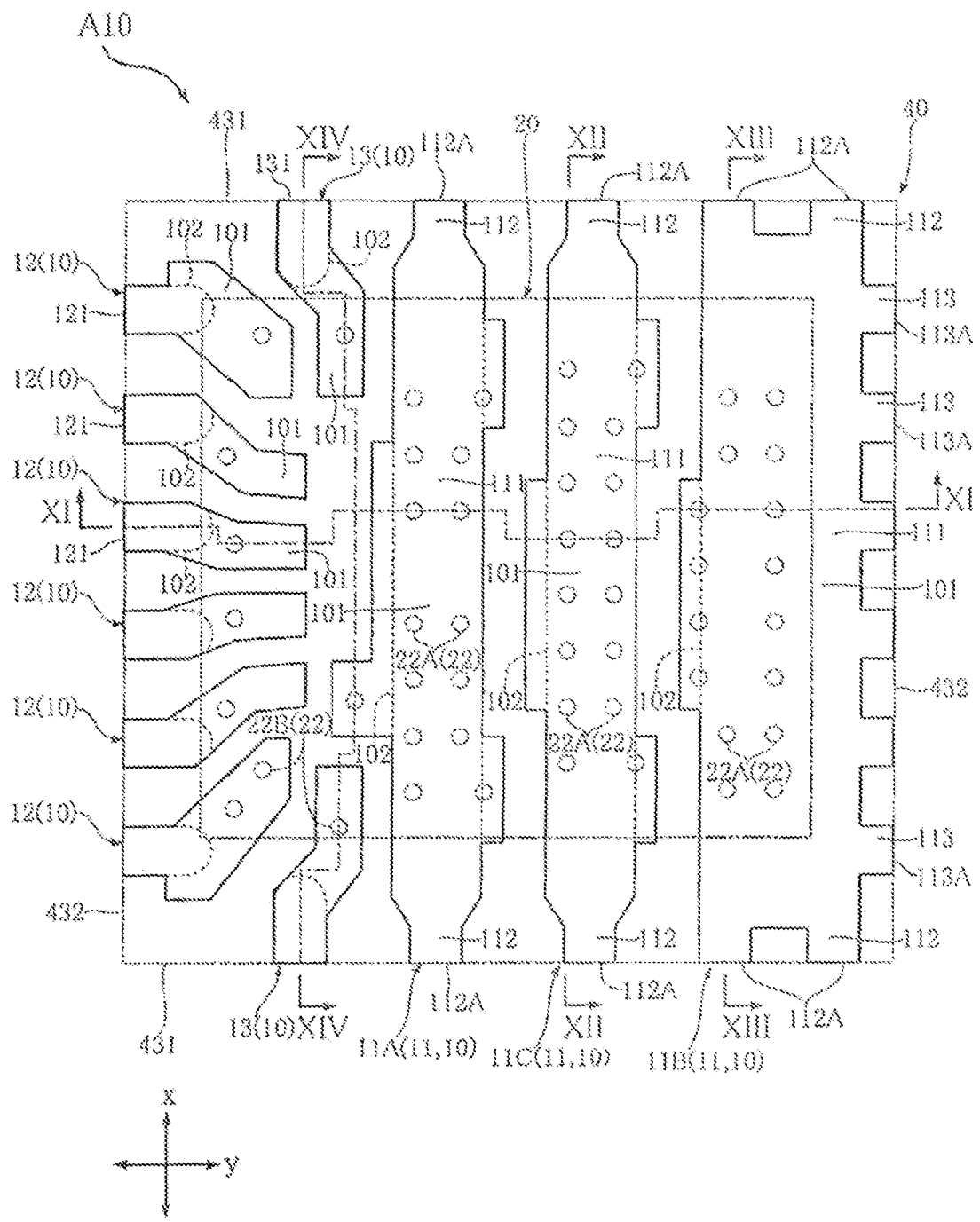
FIG. 3 is a plan view (transparent to a semiconductor element and the sealing resin) of the semiconductor device shown in FIG. 1.

In the semiconductor device A10, DC power (voltage) is converted into AC power (voltage) by the switching circuit 212A. The semiconductor device A10 is used, for example, as one element constituting a circuit of a DC/DC converter. Here, FIG. 2 is transparent to the sealing resin 40 for the sake of convenience of understanding. FIG. 3 is transparent to the element chip 20 and the sealing resin 40 for the sake of convenience of understanding. In these figures, the element chip 20 and the sealing resin 40 are shown by imaginary lines (two-dot chain lines), respectively.

In the description of the semiconductor device A10, a thickness direction Z of the conductive member 10 is referred to as a "thickness direction Z." A direction orthogonal to the thickness direction Z is referred to as a "first direction x." A direction orthogonal to both the thickness direction Z and the first direction x is referred to as a "second direction y." As shown in FIGS. 1 and 2, the semiconductor device A10 has a square shape when viewed in the thickness direction Z. Further, in the description of the semiconductor device A10, for the sake of convenience, the side on which a plurality of second leads 12 (details of which will be described later) are located in the second direction y is referred to as "one side in the second direction y." The side on which a plurality of first leads 11 (details of which will be described later) are located in the second direction y is referred to as "the other side in the second direction y."

As shown in FIG. 2, the conductive member 10 has terminals for supporting the element chip 20 and mounting the semiconductor device A10 on a wiring board. As shown in FIGS. 11 to 14, the conductive member 10 is partially covered with the sealing resin 40. The conductive member 10 has a main surface 101 (first surface) and a back surface 102 (second surface) facing opposite sides in the thickness direction Z. The main surface 101 faces one side of the thickness direction Z and faces the element chip 20.

The element chip 20 is supported by the main surface 101. The main surface 101 is covered with the sealing resin 40. The back surface 102 faces the other side in the thickness direction Z. The conductive member 10 is constituted by a single lead frame. The constituent material of the lead frame is, for example, copper (Cu) or a copper alloy. The conductive member 10 includes a plurality of first leads 11, a plurality of second leads 12, and a pair of third leads 13.

Figure 4:
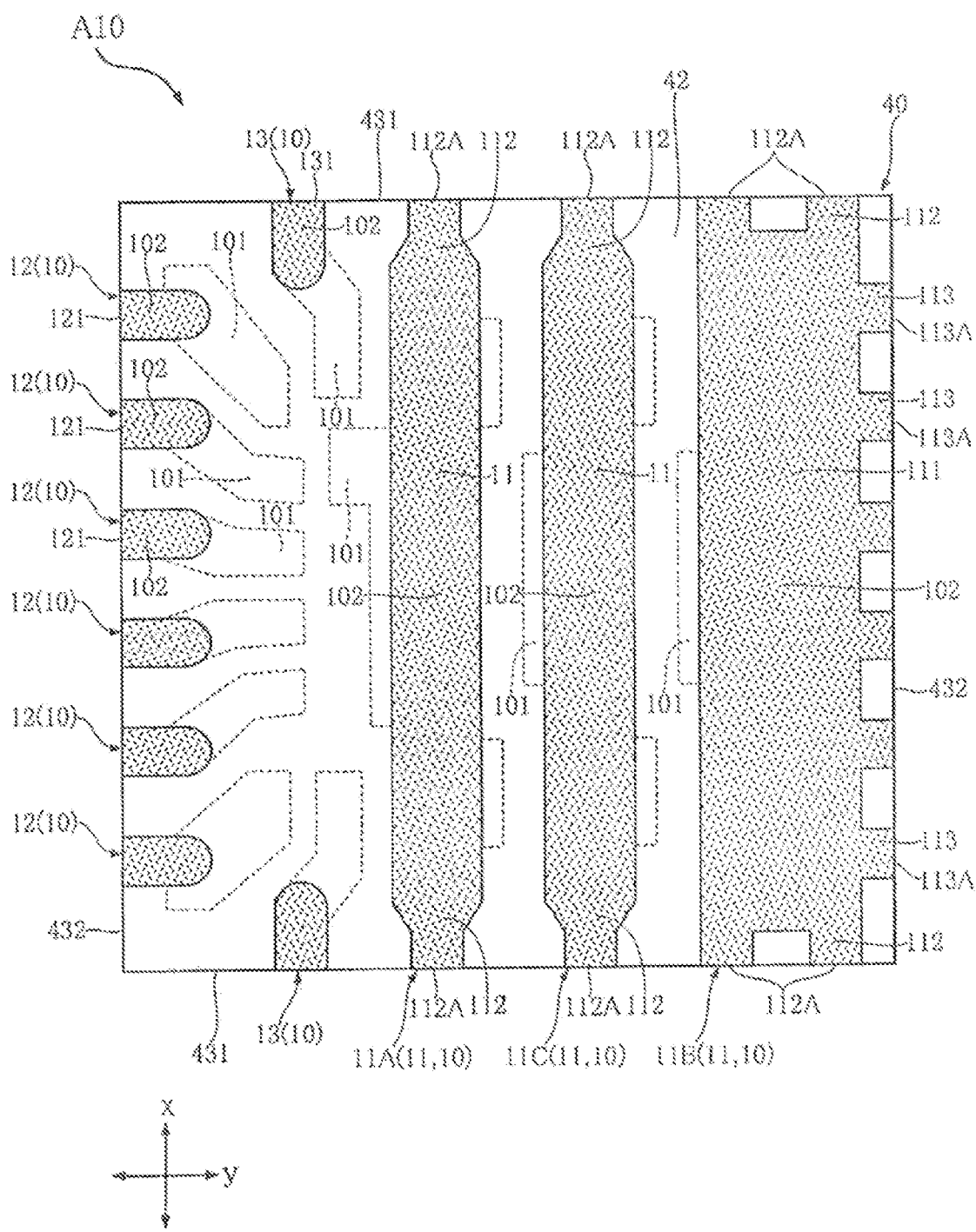
FIG. 4 is a bottom view of the semiconductor device shown in FIG. 1.

As shown in FIGS. 3 and 4, the plurality of first leads 11 have a strip shape extending in the second direction y when viewed in the thickness direction Z. The plurality of first leads 11 are arranged along the second direction y. In the example shown by the semiconductor device A10, the plurality of first leads 11 are constituted by three terminals of a first input terminal 11A, a second input terminal 11B, and an output terminal 11C. The plurality of first leads 11 are arranged in the order of the first input terminal 11A, the output terminal 11C, and the second input terminal 11B from one side toward the other side in the second direction y. DC power (voltage) to be subjected to power conversion in the semiconductor device A10 is input to the first input terminal 11A and the second input terminal 11B. The first input terminal 11A is a positive electrode (P terminal). The second input terminal 11B is a negative electrode (N terminal). The output terminal 11C outputs the AC power (voltage) which has been subjected to power conversion by the switching circuit 212A included in the element chip 20.

As shown in FIG. 3, the first input terminal 11A is located between the plurality of second leads 12 and the output terminal 11C in the second direction y. The output terminal 11C is located between the first input terminal 11A and the second input terminal 11B in the second direction y. Each of the first input terminal 11A and the output terminal 11C includes a main portion 111 and a pair of side portions 112. As shown in FIGS. 3 and 4, the main portion 111 extends in the first direction x. In the plurality of first leads 11, the element chip 20 is supported by the main surface 101 of the main portion 111.

Figure 9:
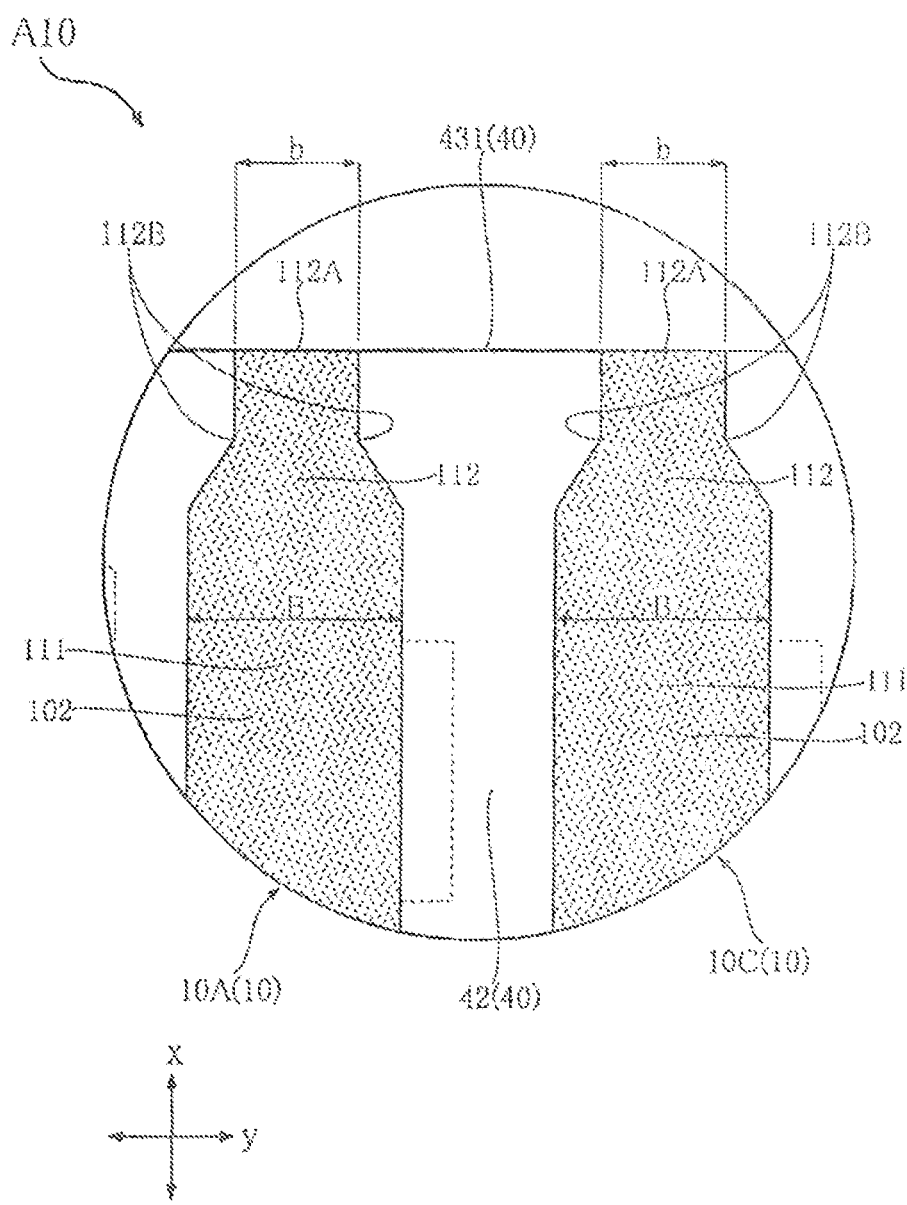
FIG. 9 is a partially enlarged view of FIG. 3.

The pair of side portions 112 are connected to both ends of the main portion 111 in the first direction x. As shown in FIGS. 3, 4, 12, and 13, each of the pair of side portions 112 has a first end surface 112A. The first end surface 112A is connected to both the main surface 101 and the back surface 102 of each first lead 11 and faces the first direction x. The first end surface 112A is exposed from the sealing resin 40. As shown in FIG. 9, a constricted portion 112B is formed in each of the pair of side portions 112 of the first input terminal 11A and the output terminal 11C. The constricted portion 112B reaches from the main surface 101 of the first lead 11 to the back surface 102 thereof and is recessed from both sides of the second direction y toward the inside of the side portion 112. The constricted portion 112B is in contact with the sealing resin 40. Due to the constricted portion 112B, in the first input terminal 11A and the output terminal 11C, a dimension b of each of the pair of first end surfaces 112A in the second direction y is smaller than a dimension B of the back surface 102 of the main portion 111 in the second direction y.

Figure 11:
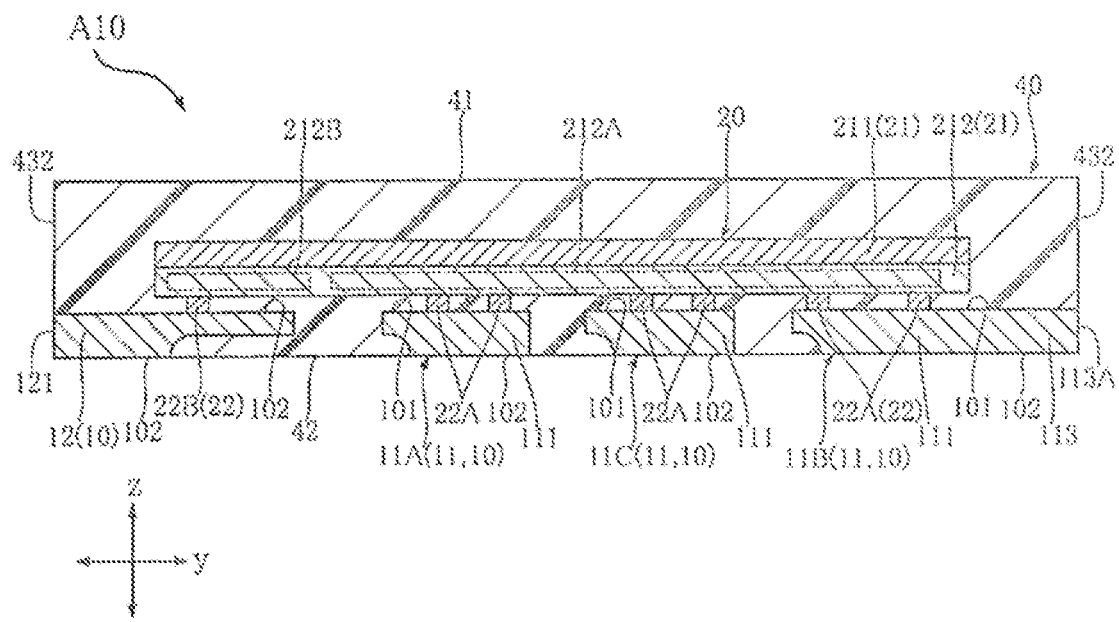
FIG. 11 is a cross-sectional view taken along line XI-XI in FIG. 3.

As shown in FIG. 3, the second input terminal 11B is located on the other side in the second direction y with respect to the output terminal 11C. Therefore, the second input terminal 11B is located on the other side of the second direction y among the plurality of first leads 11. The second input terminal 11B includes a main portion 111, a pair of side portions 112, and a plurality of protruding portions 113. The plurality of protruding portions 113 protrude from the other side of the main portion 111 in the second direction y. The sealing resin 40 is filled between two adjacent protruding portions 113. As shown in FIG. 11, each of the plurality of protruding portions 113 has a sub-end surface 113A. The sub-end surface 113A is connected to both the main surface 101 and the back surface 102 of the second input terminal 11B and faces the other side of the second direction y. The sub-end surface 113A is exposed from the sealing resin 40.

Figure 7:
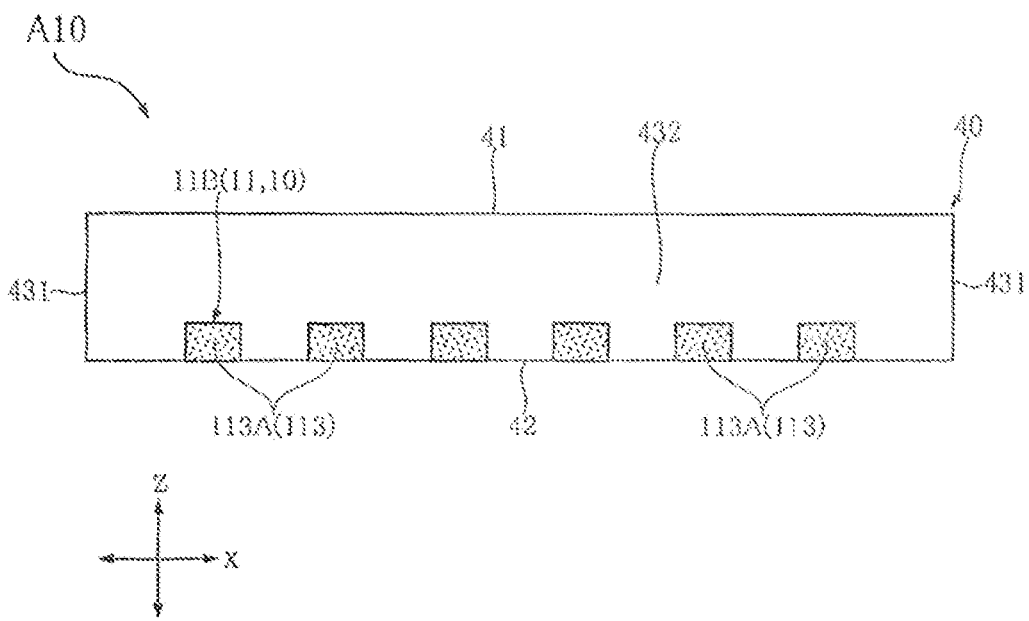
FIG. 7 is a right side view of the semiconductor device shown in FIG. 1.

As shown in FIG. 7, a plurality of sub-end surfaces 113A are arranged at predetermined intervals along the first direction x.

Figure 10:
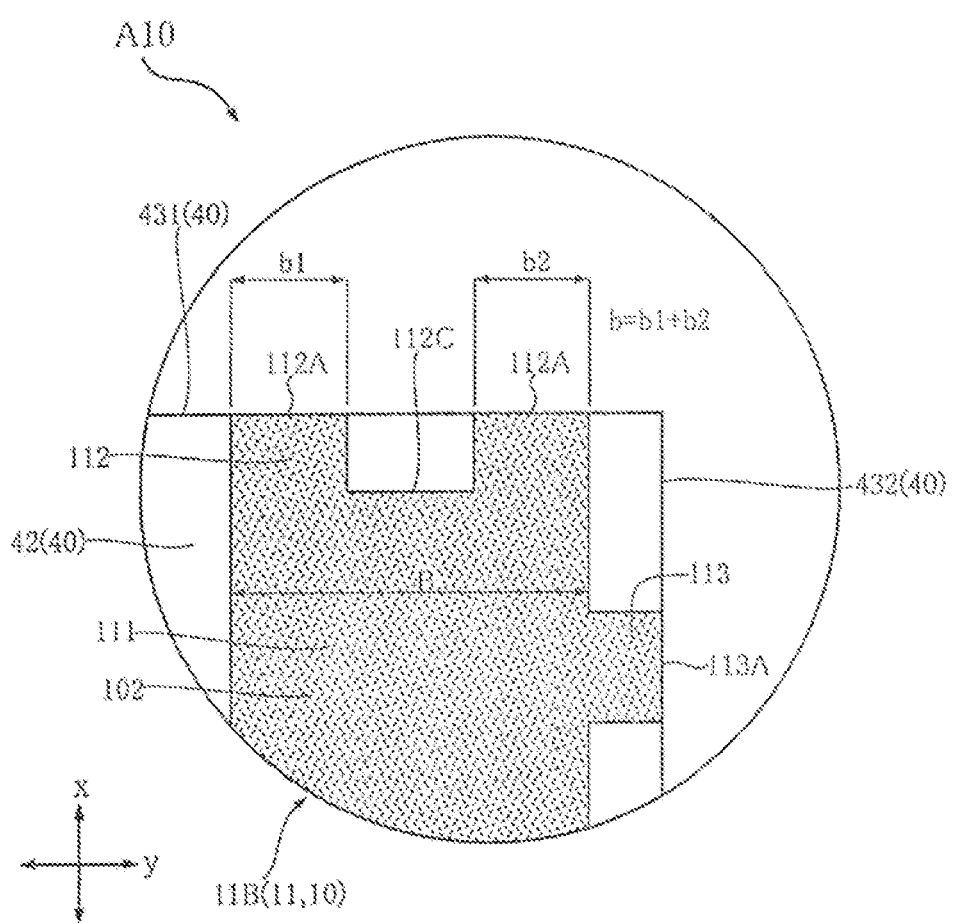
FIG. 10 is a partially enlarged view of FIG. 3.

As shown in FIG. 10, a cut portion 112C is formed in each of the pair of side portions 112 of the second input terminal 11B. The cut portion 112C reaches from the main surface 101 to the back surface 102 of the second input terminal 11B and is recessed from the first end surface 112A in the first direction x. As a result, the first end surface 112A is divided into two regions separated from each other in the second direction y. Even with the cut portion 112C, in the second input terminal 11B, the dimension b of each of the pair of first end surfaces 112A in the second direction y is smaller than the dimension B of the back surface 102 of the main portion 111 in the second direction y. Here, the dimension b is a sum of a dimension b1 of one region of the first end surface 112A in the second direction y and a dimension b2 of the other region of the first end surface 112A in the second direction y (b=b1+b2). The cut portion 112C is filled with the sealing resin 40.

As shown in FIGS. 3 and 4, in each of the plurality of first leads 11, the area of the main surface 101 is larger than the area of the back surface 102. In the example shown by the semiconductor device A10, an area of the back surface 102 of the first input terminal 11A is equal to an area of the back surface 102 of the output terminal 11C. The area of the back surface 102 of the second input terminal 11B is larger than the area of the back surface 102 of each of the first input terminal 11A and the output terminal 11C.

In each of the first input terminal 11A, the second input terminal 11B, and the output terminal 11C, the main surface 101 of the main portion 111 by which the element chip 20 is supported may be plated with, for example, silver (Ag). Further, in each of the first input terminal 11A, the second input terminal 11B, and the output terminal 11C, the back surface 102, the pair of first end surfaces 112A, and the plurality of sub-end surfaces 113A, all of which are exposed from the sealing resin 40, may be plated with, for example, tin (Sn). Instead of the tin plating, for example, a plurality of metal plating in which nickel (Ni), palladium (Pd), and gold (Au) are laminated in this order may be adopted.

Figure 8:
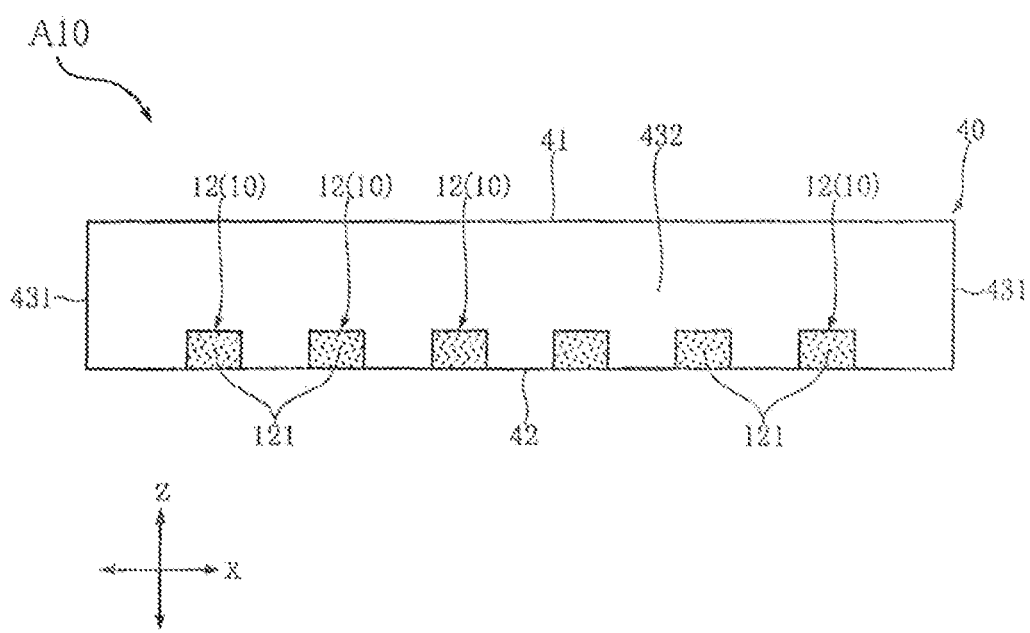
FIG. 8 is a left side view of the semiconductor device shown in FIG. 1.

As shown in FIG. 3, the plurality of second leads 12 are located on one side in the second direction y with respect to the plurality of first leads 11. One of the plurality of second leads 12 is a ground terminal of the control circuit 212B included in the element chip 20. Power (voltage) to drive the control circuit 212B or an electric signal to be transmitted to the control circuit 212B is input to each of the other plurality of second leads 12. As shown in FIGS. 3, 4, and 11, each of the plurality of second leads 12 has a second end surface 121. The second end surface 121 is connected to both the main surface 101 and the back surface 102 of each second lead 12 and faces one side in the second direction y. The second end surface 121 is exposed from the sealing resin 40. As shown in FIG. 8, the plurality of second end surfaces 121 are arranged at predetermined intervals along the first direction x.

As shown in FIGS. 3 and 4, in each of the plurality of second leads 12, the area of the main surface 101 is larger than the area of the back surface 102. The areas of the back surfaces 102 of the plurality of second leads 12 are all the same. The back surface 102 of each of the plurality of second leads 12 by which the element chip 20 is supported may be plated with, for example, silver. Further, the back surface 102 and the second end surface 121 of each of the plurality of second leads 12 exposed from the sealing resin 40 may be plated with, for example, tin. Instead of the tin plating, for example, a plurality of metal plating in which nickel, palladium, and gold are laminated in this order may be adopted.

Figure 14:
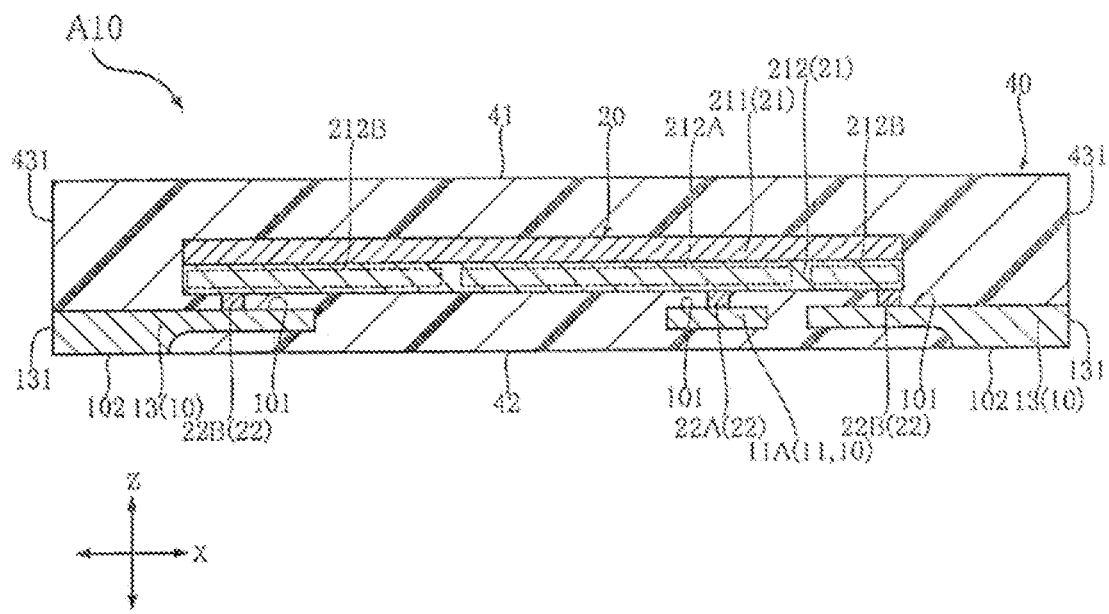
FIG. 14 is a cross-sectional view taken along line XIV-XIV in FIG. 3.

As shown in FIG. 3, the pair of third leads 13 are located between the first lead 11 (the first input terminal 11A) and the plurality of second leads 12 in the second direction y. The pair of third leads 13 are separated from each other in the first direction x. An electric signal or the like to be transmitted to the control circuit 212B included in the element chip 20 is input to each of the pair of third leads 13. As shown in FIGS. 3, 4, and 14, each of the pair of third leads 13 has a third end surface 131. The third end surface 131 is connected to both the main surface 101 and the back surface 102 and faces the first direction x. The third end surface 131 is exposed from the sealing resin 40. The third end surface 131 is arranged along the second direction y together with the first end surface 112A of each of the plurality of first leads 11.

As shown in FIGS. 3 and 4, in each of the pair of third leads 13, the area of the main surface 101 is larger than the area of the back surface 102. The main surface 101 of the pair of third leads 13 by which the element chip 20 is supported may be plated with, for example, silver. Further, the back surface 102 and the third end surface 131 of the pair of third leads 13 exposed from the sealing resin 40 may be plated with, for example, tin. Instead of the tin plating, for example, a plurality of metal plating in which nickel, palladium, and gold are laminated in this order may be adopted.

As shown in FIGS. 11 to 14, the element chip 20 is electrically bonded to and is supported by the conductive member 10 (the plurality of first leads 11, the plurality of second leads 12, and the pair of third leads 13) by flip-chip bonding. The element chip 20 is covered with the sealing resin 40. As shown in FIGS. 12 to 16, the element chip 20 includes a chip main body 21, a pad wiring layer 29, and a plurality of bonding members 22.

Figure 15:
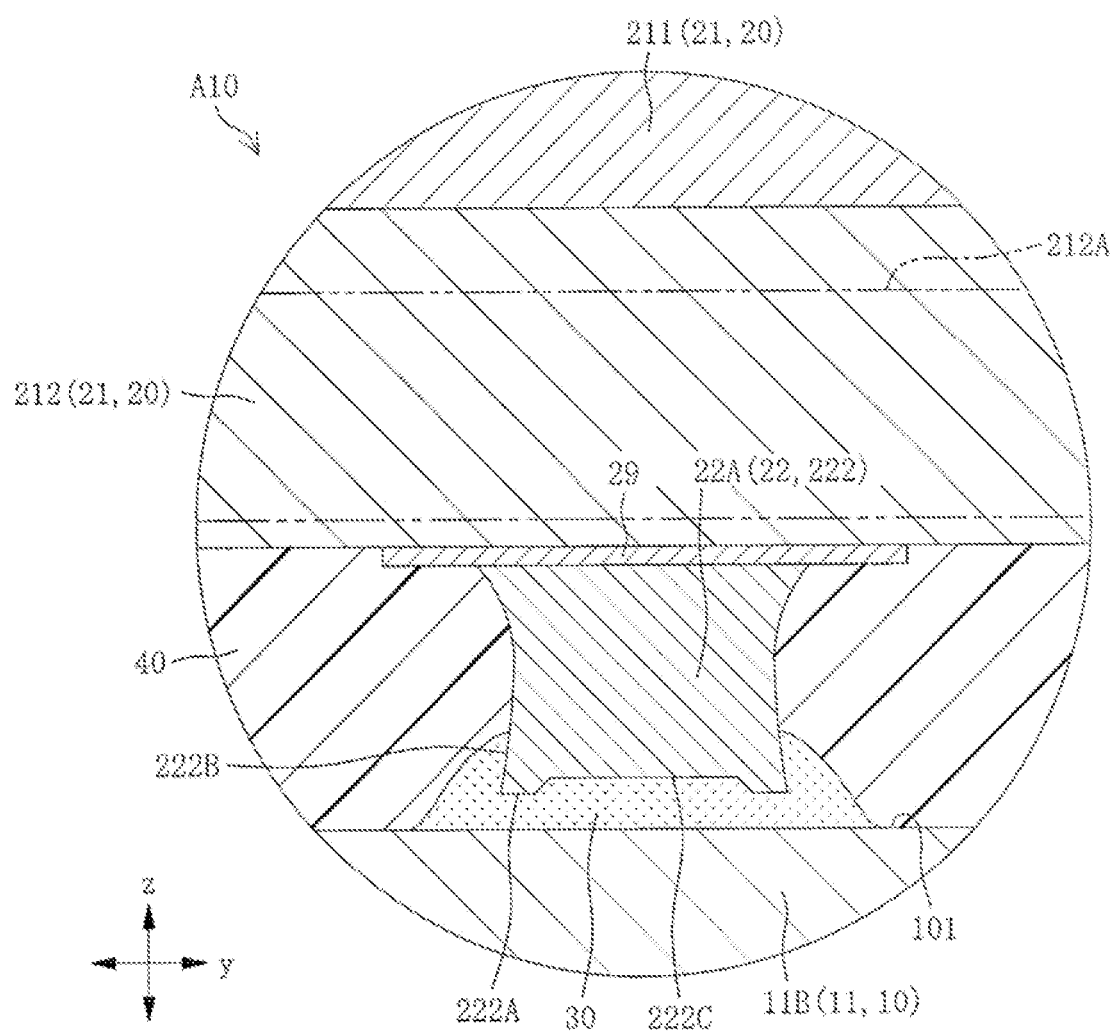
FIG. 15 is a partially enlarged view (near a first electrode) in FIG. 11.
Figure 16:
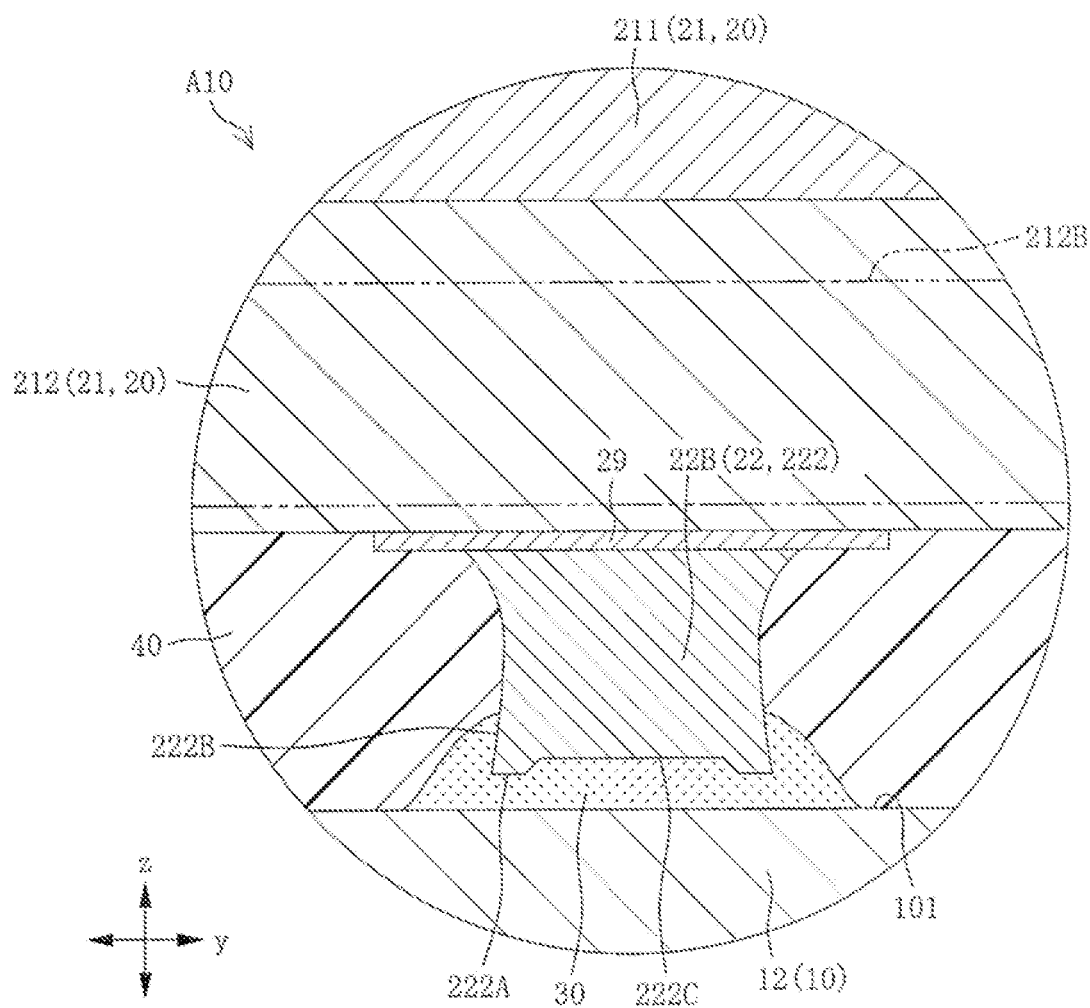
FIG. 16 is a partially enlarged view (near a second electrode) in FIG. 11.

The chip main body 21 forms the main part of the element chip 20. As shown in FIGS. 15 and 16, the chip main body 21 includes a semiconductor substrate 211 and a semiconductor layer 212. As shown in FIGS. 15 and 16, the semiconductor substrate 211 supports the semiconductor layer 212, the pad wiring layer 29, and the plurality of bonding members 22 below the semiconductor substrate 211. The constituent material of the semiconductor substrate 211 is, for example, Si (silicon) or silicon carbide (SiC).

As shown in FIGS. 11 to 14, the semiconductor layer 212 is laminated on the side of the semiconductor substrate 211 facing the main surface 101 of the conductive member 10. The semiconductor layer 212 includes a plurality of types of p-type semiconductors and n-type semiconductors based on a difference in an amount of elements to be doped. The semiconductor layer 212 includes the switching circuit 212A and the control circuit 212B electrically connected to the switching circuit 212A. The switching circuit 212A is a semiconductor element such as a MOSFET (Metal-Oxide-Semiconductor Field-Effect Transistor) or an IGBT (Insulated Gate Bipolar Transistor).

In the example shown by the semiconductor device A10, the switching circuit 212A is divided into two regions of a high voltage region (an upper arm circuit) and a low voltage region (a lower arm circuit). Each region is constituted by one n-channel MOSFET. The control circuit 212B includes a gate driver configured to drive the switching circuit 212A, a bootstrap circuit corresponding to the high voltage region of the switching circuit 212A, and the like, and performs control for driving the switching circuit 212A normally. The semiconductor layer 212 includes a wiring layer (which will be described later). The switching circuit 212A and the control circuit 212B are electrically connected to each other by the wiring layer.

As shown in FIGS. 11 to 14, the plurality of bonding members 22 protrude from the side of the chip main body 21 facing the main surface 101 of the conductive member 10 toward the main surface 101 of the conductive member 10. The plurality of bonding members 22 are electrically bonded to the main surface 101 of the conductive member 10. The plurality of bonding members 22 include a plurality of first bonding members 22A and a plurality of second bonding members 22B. The plurality of first bonding members 22A are electrically connected to the switching circuit 212A of the semiconductor layer 212. In addition, the plurality of first bonding members 22A are electrically bonded to the main surface 101 of each of the plurality of first leads 11. As a result, the plurality of first leads 11 are electrically connected to the switching circuit 212A. Further, the plurality of second bonding members 22B are electrically connected to the control circuit 212B of the semiconductor layer 212. In addition, most of the plurality of second bonding members 22B are electrically bonded to the main surface 101 of each of the plurality of second leads 12. The remaining second bonding members 22B are electrically bonded to the main surface 101 of the pair of third leads 13. As a result, the plurality of second leads 12 and the pair of third leads 13 are electrically connected to the control circuit 212B.

As shown in FIGS. 15 and 16, each of the plurality of bonding members 22 is formed on the pad wiring layer 29 formed on the semiconductor layer 212. The pad wiring layer 29 is conductive to the switching circuit 212A or the control circuit 212B of the semiconductor layer 212. The bonding member 22 is formed as a columnar body 222 protruding from the pad wiring layer 29 toward the main surface 101 of the conductive member 10. The columnar body 222 has a front end surface 222A and a side surface 222B. The front end surface 222A faces the main surface 101 of the conductive member 10. The side surface 222B is connected to the front end surface 222A and faces a direction orthogonal to the thickness direction Z. In the semiconductor device A10, the columnar body 222 may be formed with a recess 222C that is recessed from the front end surface 222A toward the chip main body 21. The columnar body 222 supplies electric power to the switching circuit 212A and the control circuit 212B formed in the semiconductor layer 212 via the pad wiring layer 29.

As shown in FIGS. 15 and 16, the bonding layer 30 is in contact with both the main surface 101 of the conductive member 10 and the plurality of bonding members 22. The bonding layer 30 has conductivity. As a result, the plurality of bonding members 22 are electrically bonded to the main surface 101 of the conductive member 10. In each of the plurality of bonding members 22, the bonding layer 30 is in contact with both the front end surface 222A and the side surface 222B of the columnar body 222. In the semiconductor device A10, the bonding layer 30 is also in contact with the recess 222C of the columnar body 222. Further, the columnar body 222 of the element chip 20 is buried in the bonding layer 30. As a result, not only the front end surface 222A and the recess 222C but also a portion of the side surface of the columnar body 222 is covered with the bonding layer 30.

As shown in FIGS. 5 to 8, the sealing resin 40 has a top surface 41, a bottom surface 42, a pair of first side surfaces 431, and a pair of second side surfaces 432. The constituent material of the sealing resin 40 is, for example, a black epoxy resin. As shown in FIGS. 11 to 14, the top surface 41 faces the same side as the main surface 101 of the conductive member 10 in the thickness direction Z. As shown in FIGS. 5 to 8, the bottom surface 42 faces the side opposite to the top surface 41. As shown in FIG. 4, the back surface 102 of the plurality of first leads 11, the back surface 102 of the plurality of second leads 12, and the back surface 102 of the pair of third leads 13 are exposed from the bottom surface 42.

Figure 12:
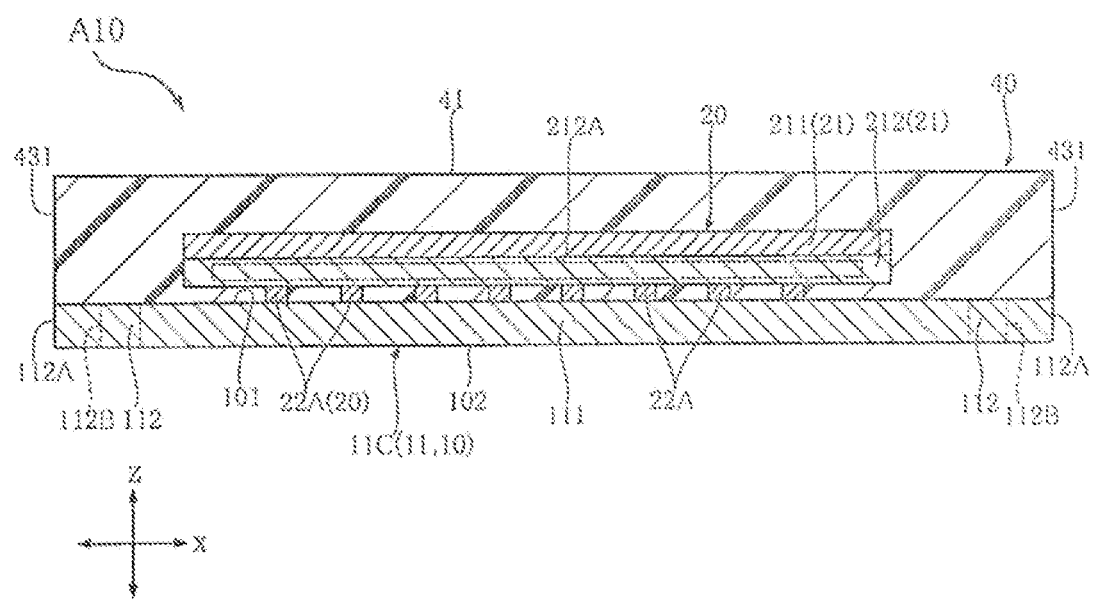
FIG. 12 is a cross-sectional view taken along line XII-XII in FIG. 3.
Figure 13:
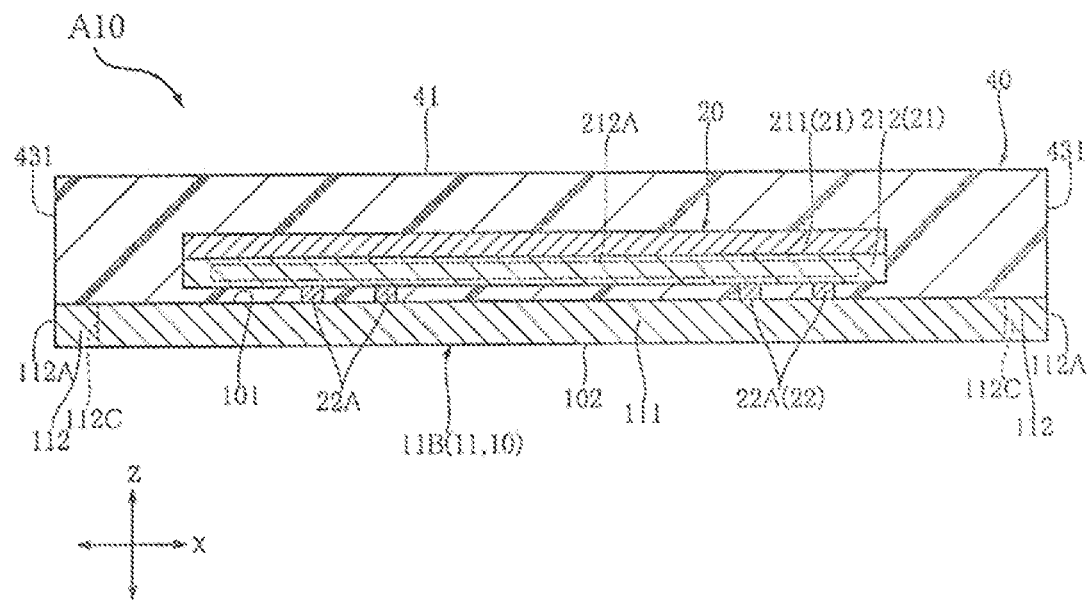
FIG. 13 is a cross-sectional view taken along line XIII-XIII in FIG. 3.

As shown in FIGS. 7 and 8, the pair of first side surfaces 431 are connected to both the top surface 41 and the bottom surface 42 and face the first direction x. The pair of first side surfaces 431 are separated from each other in the second direction y. As shown in FIGS. 12 to 14, the first end surface 112A of the plurality of first leads 11 and the third end surface 131 of the third lead 13 are exposed from each of the pair of first side surfaces 431 so that the first end surface 112A and the third end surface 131 are flush with the first side surface 431.

Figure 5:
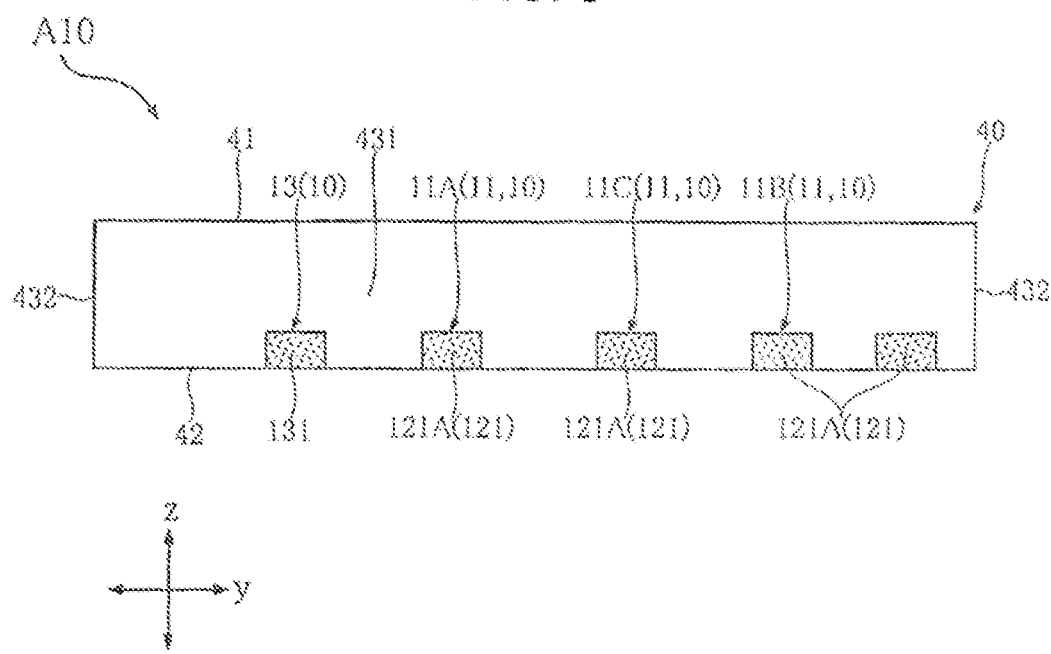
FIG. 5 is a front view of the semiconductor device shown in FIG. 1.
Figure 6:
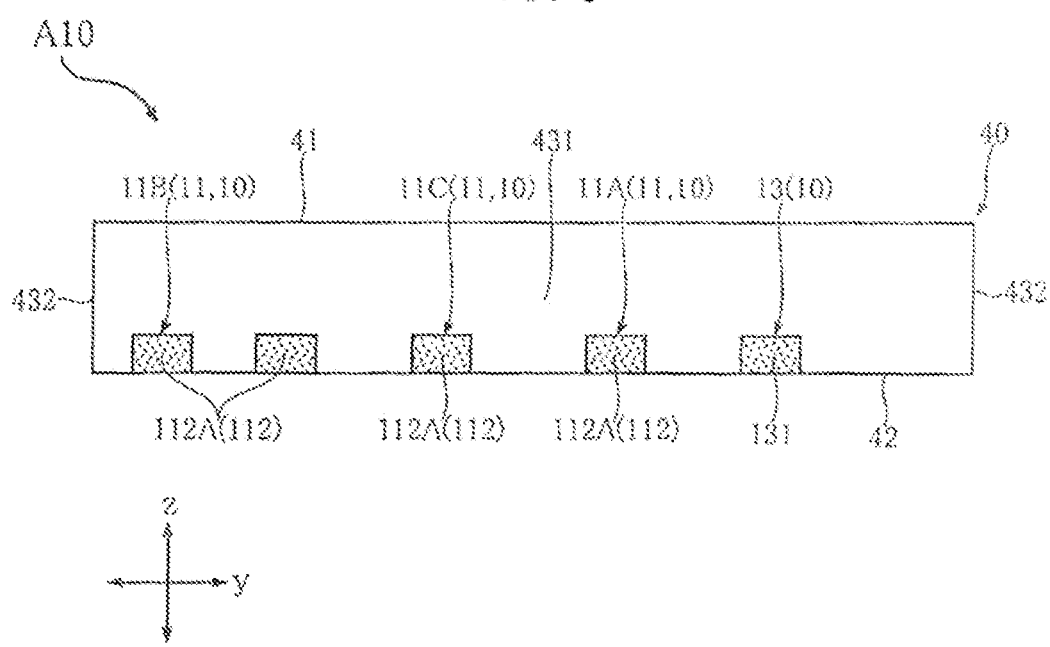
FIG. 6 is a rear view of the semiconductor device shown in FIG. 1.

As shown in FIGS. 5 and 6, the pair of second side surfaces 432 are connected to any of the top surface 41, the bottom surface 42, and the pair of first side surfaces 431 and face the second direction y. The pair of second side surfaces 432 are separated from each other in the first direction x. As shown in FIG. 11, the second end surface 121 of the plurality of second leads 12 is exposed from the second side surface 432 located on one side in the second direction y such that the second end surface 121 is flush with the second side surface 432. The plurality of sub-end surfaces 113A of the second input terminal 11B (the first lead 11) are exposed from the second side surface 432 located on the other side in the second direction y so that the plurality of sub-end surfaces 113A are flush with the second side surface 432.

The semiconductor device A10 includes the conductive member 10 having the main surface 101, the element chip 20 having the chip main body 21 and the plurality of bonding members 22 electrically bonded to the main surface 101, and the bonding layer 30 that are in contact with both the main surface 101 and the plurality of bonding members 22. Each of the plurality of bonding members 22 includes the columnar body 222 that protrudes toward the main surface 101 from the pad wiring layer 29 in contact with the side facing the main surface 101 of the chip main body 21 and that is in contact with the bonding layer 30. As a result, the element chip 20 is electrically bonded to the conductive member 10 by flip-chip bonding.

Figure 17:
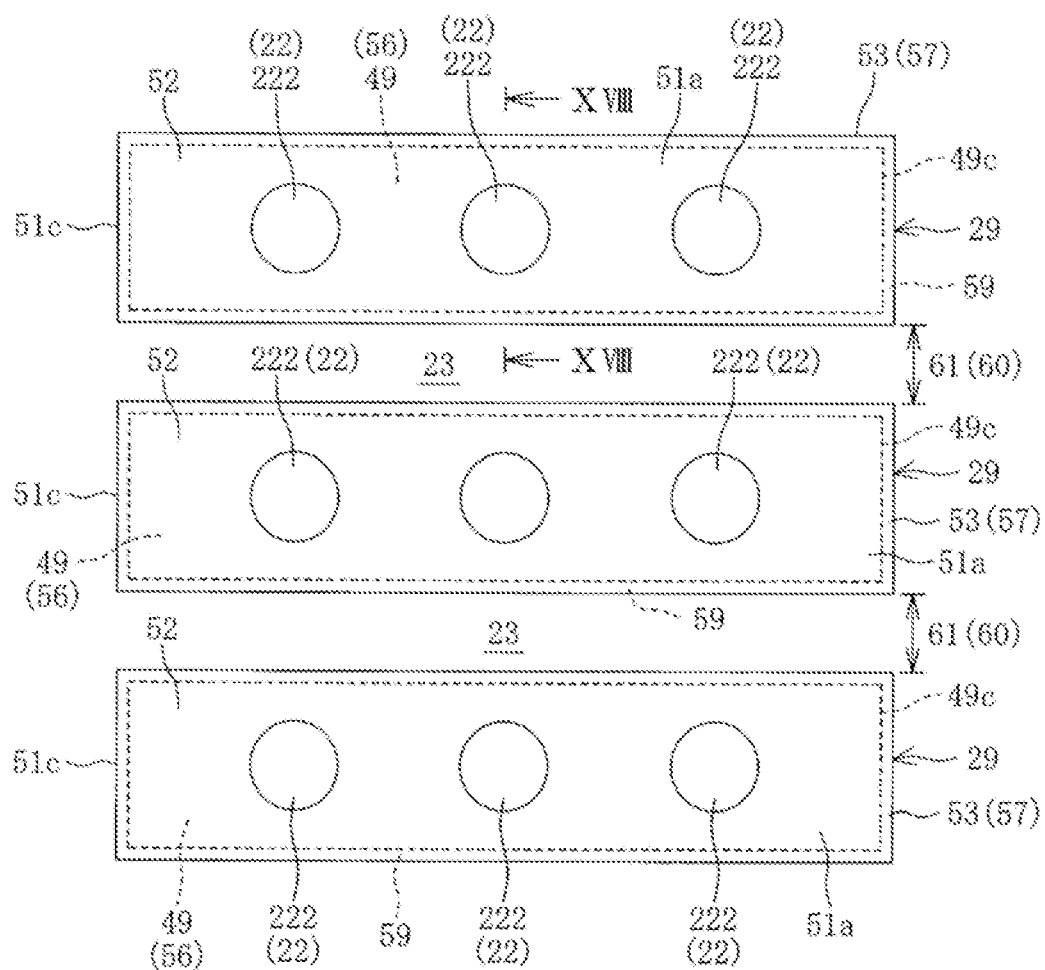
FIG. 17 is a schematic plan view for explaining a wiring structure of an element chip.
Figure 18:
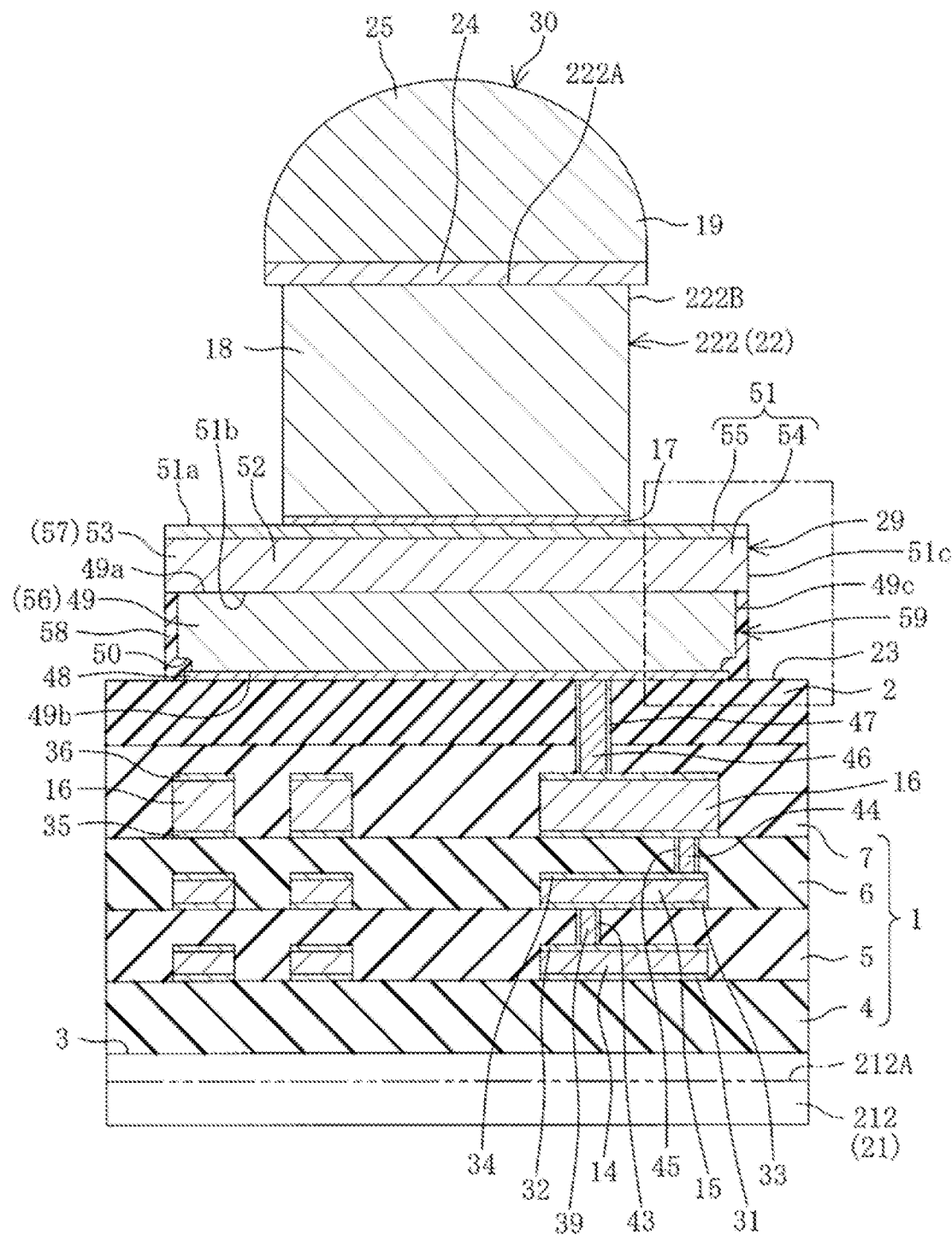
FIG. 18 is a schematic cross-sectional view of the element chip, which is taken along line XVIII-XVIII in FIG. 17.

FIG. 17 is a schematic plan view for explaining a wiring structure of the element chip 20. FIG. 18 is a cross-sectional view taken along line XVIII-XVIII in FIG. 17. FIG. 17 shows a portion of the planar structure of the element chip 20, more specifically, the first bonding member 22A and the pad wiring layer 29 that supports the first bonding member 22A. Although the description of the second bonding member 22B and the pad wiring layer 29 that supports the second bonding member 22B is omitted, the structure thereof is the same as that of the first bonding member 22A and the pad wiring layer 29 shown in FIG. 17. FIG. 18 shows the element chip 20 before being bonded to the conductive member 10 by flip-chip bonding. Further, in FIG. 18, the element chip 20 is shown in a state where the columnar body 222 (the first bonding member 22A) protrudes upward. Therefore, the above-described FIGS. 11 to 16 and FIG. 18 are upside down.

The element chip 20 includes a multilayer wiring structure 1, a passivation layer 2, a pad wiring layer 29, a coating insulating film 58, a columnar body 222 (bonding member 22), and a bonding layer 30. FIG. 18 shows only one of the plurality of bonding members 22. The multilayer wiring structure 1 includes a plurality of interlayer insulating films 4 to 7 formed on an element forming surface 3 of the semiconductor layer 212, and a plurality of wiring layers 14 to 16 formed in the plurality of interlayer insulating films 4 to 7. Since the wiring layers 14 to 16 form the multilayer wiring structure 1, they may be referred to as wiring layers 14 to 16, respectively.

The plurality of interlayer insulating films 4 to 7 include a first interlayer insulating film 4 formed on the element forming surface 3 of the semiconductor layer 212, a second interlayer insulating film 5 formed on the first interlayer insulating film 4, a third interlayer insulating film 6 formed on the second interlayer insulating film 5, and a fourth interlayer insulating film 7 formed on the third interlayer insulating film 6. The first interlayer insulating film 4, the second interlayer insulating film 5, the third interlayer insulating film 6, and the fourth interlayer insulating film 7 may each include an oxide film ($SiO_2$ film) or a nitride film (SiN film).

The plurality of wiring layers 14 to 16 are electrically connected to the switching circuit 212A and the control circuit 212B formed on the semiconductor layer 212 (in FIG. 18, only the switching circuit 212A is shown). The plurality of wiring layers 14 to 16 include a first wiring layer 14 formed on the first interlayer insulating film 4 and coated on the second interlayer insulating film 5, a second wiring layer 15 formed on the second interlayer insulating film 5 and coated on the third interlayer insulating film 6, and a third wiring layer 16 formed on the third interlayer insulating film 6 and coated on the fourth interlayer insulating film 7. Each of the first wiring layer 14, the second wiring layer 15, and the third wiring layer 16 may contain copper or aluminum.

A first barrier layer 31 is formed on the lower surface of the first wiring layer 14. The first barrier layer 31 suppresses an electrode material constituting the first wiring layer 14 from diffusing into the first interlayer insulating film 4. A first barrier layer 32 is formed on the upper surface of the first wiring layer 14. The first barrier layer 32 suppresses the electrode material constituting the first wiring layer 14 from diffusing into the second interlayer insulating film 5. A second barrier layer 33 is formed on the lower surface of the second wiring layer 15. The second barrier layer 33 suppresses an electrode material constituting the second wiring layer 15 from diffusing into the second interlayer insulating film 5.

A second barrier layer 34 is formed on the upper surface of the second wiring layer 15. The second barrier layer 34 suppresses the electrode material constituting the second wiring layer 15 from diffusing into the third interlayer insulating film 6. A third barrier layer 35 is formed on the lower surface of the third wiring layer 16. The third barrier layer 35 suppresses an electrode material constituting the third wiring layer 16 from diffusing into the third interlayer insulating film 6. A third barrier layer 36 is formed on the upper surface of the third wiring layer 16. The third barrier layer 36 suppresses the electrode material constituting the third wiring layer 16 from diffusing into the fourth interlayer insulating film 7.

Each of the barrier layers 31 to 36 may have a single-layer structure including a titanium nitride layer or a titanium layer, or may have a laminated structure including a titanium nitride layer and a titanium layer formed on the titanium nitride layer. Each of the barrier layers 31 to 36 may be a layer made of the same material, or may be a layer made of different materials. The passivation layer 2 is formed on the multilayer wiring structure 1 so as to cover the multilayer wiring structure 1. More specifically, the passivation layer 2 covers the fourth interlayer insulating film 7.

The passivation layer 2 may include an oxide film ($SiO_2$ film), a BPSG (Boron Phosphorus Silicon Glass) film, or a nitride film (SiN film). In the present embodiment, the passivation layer 2 is formed of a nitride film (SiN film). The passivation layer 2 may be referred to as an uppermost insulating layer or a surface protective layer of the multilayer wiring structure 1. A first via 39 penetrating the second interlayer insulating film 5 is formed in the second interlayer insulating film 5 between the upper surface of the first wiring layer 14 and the lower surface of the second wiring layer 15. The first wiring layer 14 is electrically connected to the second wiring layer 15 through the first via 39.

A first via barrier film 43 is formed between the first via 39 and the second interlayer insulating film 5. The first via 39 may contain tungsten. The first via barrier film 43 may contain titanium nitride. A second via 44 penetrating the third interlayer insulating film 6 is formed in the third interlayer insulating film 6 between the upper surface of the second wiring layer 15 and the lower surface of the third wiring layer 16. The second wiring layer 15 is electrically connected to the third wiring layer 16 through the second via 44.

A second via barrier film 45 is formed between the second via 44 and the third interlayer insulating film 6. The second via 44 may contain tungsten. The second via barrier film 45 may contain titanium nitride. A third via 46 penetrating the passivation layer 2 and the fourth interlayer insulating film 7 is formed in the passivation layer 2 and the fourth interlayer insulating film 7 on the third wiring layer 16. The third via 46 is exposed from the passivation layer 2 and is electrically connected to the third wiring layer 16.

The exposed surface of the third via 46 is formed to be flush with the upper surface 23 of the passivation layer 2. A third via barrier film 47 is formed between the third via 46 and the fourth interlayer insulating film 7 and between the third via 46 and the passivation layer 2. The third via 46 may contain tungsten. The third via barrier film 47 may contain titanium nitride. The pad wiring layer 29 is formed on the upper surface 23 of the passivation layer 2 so as to cover the third via 46. As shown in FIG. 17, the pad wiring layer 29 is formed in a strip shape in a plan view, and may support a plurality of columnar bodies 222. In this embodiment, a plurality of pad wiring layers 29 are formed at intervals from each other. Since the pad wiring layer 29 is a wiring formed on the uppermost surface of the multilayer wiring structure 1, it may be referred to as an uppermost wiring layer, an uppermost layer wiring, a top metal wiring layer, or the like. The pad wiring layer 29 has a laminated structure including a barrier conductive layer 48 formed on the passivation layer 2, and a first conductive layer 56 containing metal including copper as a main component and formed on the main surface of the barrier conductive layer 48. Since the first conductive layer 56 contains metal including copper as a main component, it may be referred to as a Cu conductive layer 49. The barrier conductive layer 48 suppresses the electrode material of the Cu conductive layer 49 from diffusing into the passivation layer 2.

Here, the phrase "metal including copper as a main component" refers to metal having a mass ratio (mass %) of copper constituting the Cu conductive layer 49 higher than that of any other component constituting the Cu conductive layer 49 (the same shall apply hereinafter). When the Cu conductive layer 49 is made of an aluminum-copper alloy (Al—Cu alloy), a mass ratio of copper $R_{Cu}$ is higher than a mass ratio of aluminum RAl ($R_{Cu} > R_{Al}$). When the Cu conductive layer 49 is made of an aluminum-silicon-copper alloy (Al—Si—Cu alloy), the mass ratio of copper $R_{Cu}$ is higher than the mass ratio of aluminum $R_{Al}$ and a mass ratio of silicon $R_{Si}$ ($R_{Cu} > R_{Al}$ and $R_{Cu} > R_{Si}$).

The phrase "metal including copper as a main component" may include a very small amount of impurities, but also include high-purity copper having a purity of 99.9999% (6N) or higher or high-purity copper having a purity of 99.99% (4N) or higher. The barrier conductive layer 48 is formed on the passivation layer 2 so as to cover the third via 46. The barrier conductive layer 48 is electrically connected to the first wiring layer 14, the second wiring layer 15, and the third wiring layer 16 through the third via 46.

The barrier conductive layer 48 may have a thickness of 100 nm or more and 500 nm or less (about 100 nm in this embodiment). The barrier conductive layer 48 may have a single-layer structure including a single metal layer. The barrier conductive layer 48 may have a laminated structure in which a plurality of metal layers are laminated. The barrier conductive layer 48 preferably has a thermal expansion coefficient smaller than that of the Cu conductive layer 49. Further, the barrier conductive layer 48 preferably has a rigidity larger than that of the Cu conductive layer 49.

The barrier conductive layer 48 may contain at least one of titanium, titanium nitride, tantalum, tungsten, molybdenum, chromium, and ruthenium. According to these metal materials, the barrier conductive layer 48 having a thermal expansion coefficient (4 μm/m·K or more and 9 μm/m·K or less) smaller than the thermal expansion coefficient of the Cu conductive layer 49 can be realized. When the Cu conductive layer 49 is made of high-purity copper, the thermal expansion coefficient of the Cu conductive layer 49 is about 16.5 μm/m·K.

The barrier conductive layer 48 may contain at least one of tantalum, tungsten, molybdenum, chromium, and ruthenium. According to these metal materials, the barrier conductive layer 48 having a thermal expansion coefficient (4 μm/m·K or more and 7 μm/m·K or less) smaller than the thermal expansion coefficient of the Cu conductive layer 49 can be realized. Further, according to these metal materials, the barrier conductive layer 48 having a rigidity (50 Gpa or more and 180 Gpa or less) larger than that of the Cu conductive layer 49 can be realized. When the Cu conductive layer 49 is made of high-purity copper, the rigidity of the Cu conductive layer 49 is about 48 Gpa.

The Cu conductive layer 49 occupies most of the pad wiring layer 29. The Cu conductive layer 49 may have a thickness of 2 μm or more and 6 μm or less. The Cu conductive layer 49 has an upper surface 49a (first surface), a lower surface 49b (second surface) located on the opposite side of the upper surface 49a, and a side surface 49c (end surface) connecting the upper surface 49a and the lower surface 49b. The lower surface 49b of the Cu conductive layer 49 is mechanically and electrically connected to the barrier conductive layer 48.

The peripheral edge of the lower surface 49b of the Cu conductive layer 49 is separated inward of the barrier conductive layer 48 from the peripheral edge of the barrier conductive layer 48. The lower surface 49b of the Cu conductive layer 49 is formed to be narrower than the upper surface 49a of the Cu conductive layer 49 in a direction along the upper surface 23 of the passivation layer 2. More specifically, in the Cu conductive layer 49, a recess 50, which is recessed inward toward the Cu conductive layer 49 and exposes the upper surface of the edge portion of the barrier conductive layer 48, is formed in a region of the side surface 49c on the side of the lower surface 49b.

The recess 50 is formed in a convex-curved shape that swells diagonally upward of the Cu conductive layer 49. As a result, the inner surface of the recess 50 is a convex-curved surface. The lower surface 49b of the Cu conductive layer 49 is formed to be narrower than the upper surface 49a of the Cu conductive layer 49 by the recess 50. In this embodiment, the side surface 49c of the Cu conductive layer 49 is located outside the peripheral edge (side surface) of the barrier conductive layer 48. Therefore, in this embodiment, the peripheral edge (side surface) of the barrier conductive layer 48 is located in a region between the peripheral edge of the lower surface 49b of the Cu conductive layer 49 and the side surface 49c of the Cu conductive layer 49. The side surface 49c of the Cu conductive layer 49 may be located inside the peripheral edge (side surface) of the barrier conductive layer 48.

The pad wiring layer 29 includes a second conductive layer 51 formed on the upper surface 49a of the Cu conductive layer 49. The second conductive layer 51 is formed on the upper surface 49a of the Cu conductive layer 49 so as to cover the upper surface 49a of the Cu conductive layer 49. The second conductive layer 51 includes a first portion 52 mechanically and electrically connected to the upper surface 49a of the Cu conductive layer 49, and a second portion 53 protruding from the first portion 52 outward from the side surface 49c of the Cu conductive layer 49. Since the second portion 53 has an eaves shape formed in the upper portion of the pad wiring layer 29 in the thickness direction, it may be referred to as an eaves portion 57.

The second conductive layer 51 has an upper surface 51a (first surface), a lower surface 51b (second surface) located on the opposite side of the upper surface 51a, and a side surface 51c (end surface) connecting the upper surface 51a and the lower surface 51b. The lower surface 51b of the second conductive layer 51 is mechanically and electrically connected to the Cu conductive layer 49 (the first conductive layer 56). The side surface 51c of the second conductive layer 51 is arranged outside the pad wiring layer 29 with respect to the side surface 49c of the Cu conductive layer 49. As a result, a recess 59 is formed below the eaves portion 57 due to a step between the side surface 51c of the second conductive layer 51 and the side surface 49c of the Cu conductive layer 49. In this embodiment, as shown in FIG. 17, the eaves portion 57 is formed in an annular shape over the entire outer periphery of the pad wiring layer 29 in a plan view. As a result, the recess 59 is formed in an annular shape over the entire circumference below the annular eaves portion 57. The recess 59 may be a portion surrounded by the upper surface 23 of the passivation layer 2, the side surface 49c of the first conductive layer 56, and the eaves portion 57.

In this embodiment, the second conductive layer 51 has a laminated structure including a first layer 54 formed on the upper surface 49a of the Cu conductive layer 49 and a second layer 55 formed on the first layer 54. The first layer 54 and the second layer 55 are made of a material having a linear expansion coefficient smaller than linear expansion coefficients of the Cu conductive layer 49 and a Cu columnar body 18 (which will be described later). For example, the linear expansion coefficients of the Cu conductive layer 49 and the Cu columnar body 18 may be 16.0 or more and 18.0 ($10^{-6}$/degree C.) or less, and the linear expansion coefficients of the first layer 54 and the second layer 55 may be 10.0 or more and 15.0 ($10^{-6}$/degree C.) or less.

Examples of the materials used for the first layer 54 and the second layer 55 may include Ni=13.3 ($10^{-6}$/degree C.), Pd=11.8 ($10^{-6}$/degree C.), Au=14.2 ($10^{-6}$/degree C.), W=4.3

($10^{-6}$/degree C.), Pt=8.9 ($10^{-6}$/degree C.), and the like. Of these, in this embodiment, the first layer 54 is formed of a nickel (Ni) layer, and the second layer 55 is formed of a palladium (Pd) layer.

The second layer 55 is formed with a thickness smaller than the thickness of the first layer 54. The second layer 55 may be metal having a mass ratio (mass %) of palladium constituting the second layer 55 higher than that of any other component constituting the second layer 55. In other words, the second layer 55 may be metal including palladium as a main component. Further, the first layer 54 may be metal having a mass ratio (mass %) of nickel constituting the first layer 54 higher than that of any other component constituting the first layer 54. In other words, the first layer 54 may be metal including nickel as a main component.

The thickness of the first layer 54 may be 0.5 μm or more and 5 μm or less. The thickness of the second layer 55 may be 0.05 μm or more and 0.5 μm or less. The coating insulating film 58 is formed on the passivation layer 2. The coating insulating film 58 will be described in detail with reference to FIGS. 19 to 22. First, referring to FIG. 19, the coating insulating film 58 is selectively formed in the recess 59 below the eaves portion 57 on the passivation layer 2. In this embodiment, since the recess 59 is formed in an annular shape in a plan view (see FIG. 17), the coating insulating film 58 is also formed in an annular shape in the same manner. The annular coating insulating film 58 covers the side surface 49c of the first conductive layer 56 by wrapping the first conductive layer 56 from the side in the recess 59.

Here, the phrase "selectively formed in the recess 59" may mean that, for example, all or most of the coating insulating film 58 is formed in a region inside the recess 59 in the region of the upper surface 23 of the passivation layer 2. For example, in a case where a protrusion amount S of the coating insulating film 58 outward from the side surface 51c of the second conductive layer 51 is within a range smaller than a first thickness T3 of the coating insulating film 58 in the thickness direction of the pad wiring layer 29 (S<T3) (see FIGS. 21 and 22), it may be defined as "the coating insulating film 58 is selectively formed in the recess 59." As a result, the coating insulating film 58 may be substantially hidden below the eaves portion 57 in a plan view.

The coating insulating film 58 has a side surface 58c along the side surface 51c of the second conductive layer 51 in the thickness direction of the pad wiring layer 29. The phrase "the side surface 58c along the side surface 51c of the second conductive layer 51" may be defined as a side surface 58c formed substantially parallel to the side surface 51c of the second conductive layer 51 in a region within a range of the width $W_1$ (width W1<thickness $T_2$ of the second conductive layer 51) inward and outward from the side surface 51c of the second conductive layer 51. The phrase "surface substantially parallel to the side surface 51c" may include a surface parallel to the side surface 51c and a surface inclined at about ±5° with respect to the side surface 51c.

Figure 19:
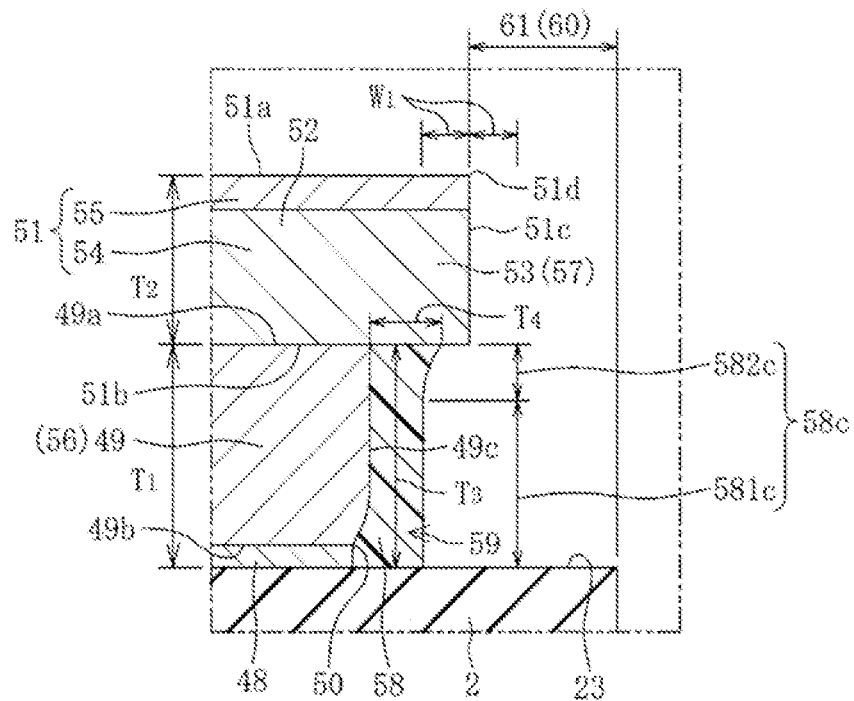
FIG. 19 is an enlarged view of a portion surrounded by a two-dot chain line A in FIG. 18, showing a first form of a coating insulating film.

In FIG. 19, the coating insulating film 58 has the side surface 58c arranged inside the pad wiring layer 29 with respect to the side surface 51c in the region within the range of the width $W_1$ inward from the side surface 51c of the second conductive layer 51. The entire side surface 58c of the coating insulating film 58 may be substantially parallel to the side surface 51c, or a portion of the side surface 58c may be substantially parallel to the side surface 51c and the rest of the side surface 58c may not be substantially parallel to the side surface 51c. For example, as shown in FIG. 19, a case where the side surface 58c in the thickness direction of the first conductive layer 56 is divided into a first region 581c substantially parallel to the side surface 51c and a second region 582c not substantially parallel to the side surface 51c is considered. In this case, the first region 581c may occupy more than 50% (preferably 70% or more and 90% or less) of the side surface 58c and the second region 582c may occupy less than 50% (preferably 10% or more and 30% or less) of the side surface 58c. As shown in FIG. 19, the first region 581c may be formed on the lower side of the side surface 58c with respect to the second region 582c. Further, the second region 582c may be linear in a cross-sectional view, or may be formed in an arc shape as shown in FIG. 19.

The coating insulating film 58 has the first thickness $T_3$ in the thickness direction of the pad wiring layer 29 and a second thickness $T_4$ in a direction intersecting the thickness direction of the pad wiring layer 29. The second thickness $T_4$ of the coating insulating film 58 is smaller than the first thickness $T_3$. For example, the first thickness $T_3$ may be equal (for example, about 2 μm or more and 6 μm or less) to a thickness $T_1$ of the first conductive layer 56. In a peripheral region 60 of the pad wiring layer 29, the upper surface 23 of the passivation layer 2 is exposed from the coating insulating film 58. For example, in FIG. 17, a region 61 between the adjacent pad wiring layers may be the peripheral region 60, and the upper surface 23 of the passivation layer 2 may be exposed in the region 61.

Since the coating insulating film 58 is selectively formed in the recess 59, the upper surface 51a and the side surface 51c of the second conductive layer 51 are exposed from the coating insulating film 58. In other words, the coating insulating film 58 is a film that selectively covers the first conductive layer 56 of the pad wiring layer 29, and the second conductive layer 51 is not covered with the coating insulating film 58. Therefore, the upper surface 51a and the side surface 51c of the second conductive layer 51 are continuous exposed surfaces via a boundary portion 51d (in this embodiment, the upper corner portion of the second conductive layer 51) between the upper surface 51a and the side surface 51c, and are exposed from the coating insulating film 58. In particular, the entire upper surface 51a of the second conductive layer 51 is exposed from the coating insulating film 58. Therefore, the entire upper surface 51a of the second conductive layer 51 is used as a pad region to which the bonding member 22 can be bonded.

Figure 20:
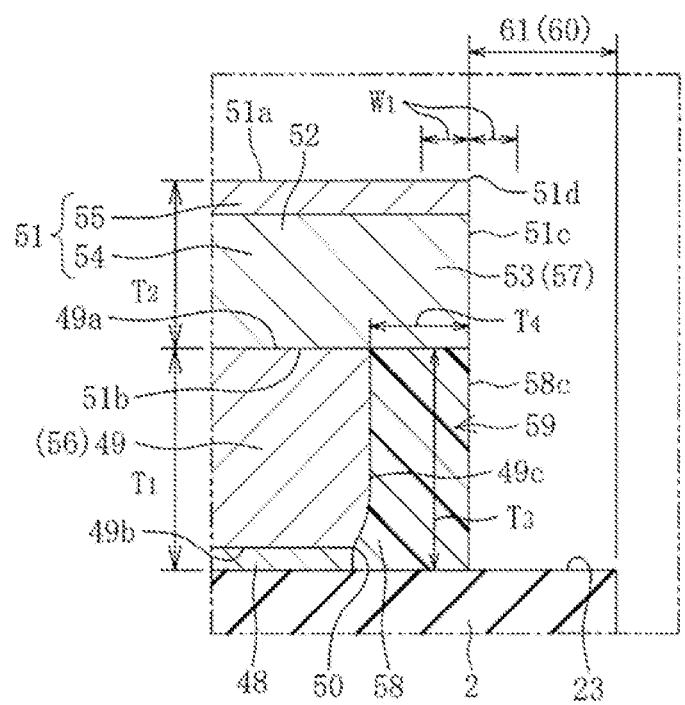
FIG. 20 is an enlarged view of the portion surrounded by the two-dot chain line A in FIG. 18, showing a second form of the coating insulating film.
Figure 21:
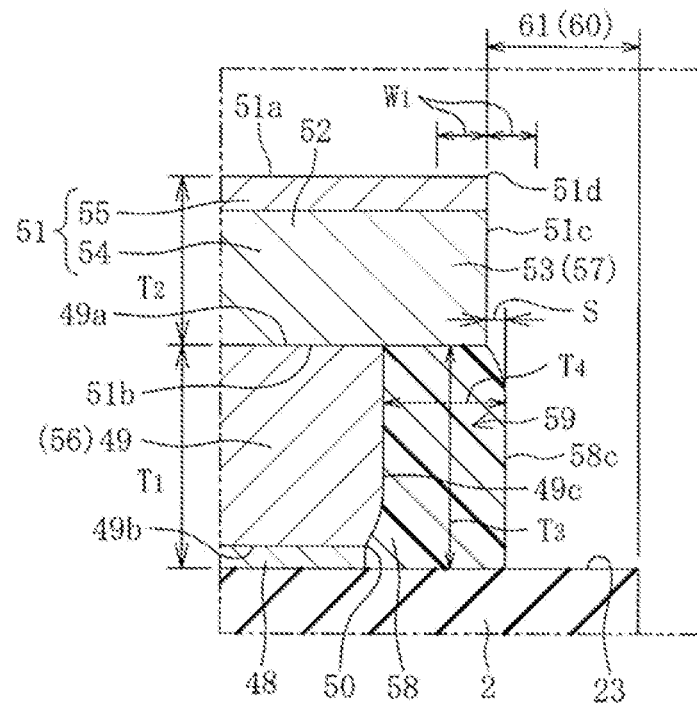
FIG. 21 is an enlarged view of the portion surrounded by the two-dot chain line A in FIG. 18, showing a third form of the coating insulating film.
Figure 22:
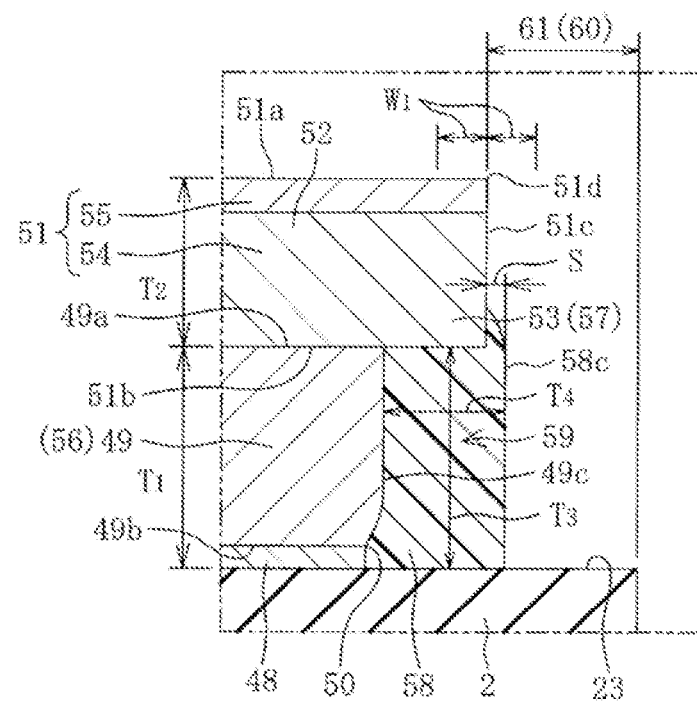
FIG. 22 is an enlarged view of the portion surrounded by the two-dot chain line A in FIG. 18, showing a fourth form of the coating insulating film.

The coating insulating film 58 is formed of a film having electrical insulating properties and may be, for example, a resin film. Examples of the resin film may include a polyimide resin film, a phenol resin film, and the like. The coating insulating film 58 may be an insulating film (for example, a silicon oxide film, a silicon nitride film, or the like) other than the resin film. Referring to FIG. 20, the coating insulating film 58 may have the side surface 58c flush with the side surface 51c of the second conductive layer 51. Further, referring to FIGS. 21 and 22, the coating insulating film 58 may have the side surface 58c arranged at an outer side of the pad wiring layer 29 than the side surface 51c in the region within the width $W_1$ outward from the side surface 51c of the second conductive layer 51. In this case, as shown in FIG. 22, the lower portion of the side surface 51c of the second conductive layer 51 may be selectively covered with the coating insulating film 58.

Referring to FIGS. 17 and 18, the bonding member 22 (the columnar body 222) is bonded to the upper surface 51a of the second conductive layer 51 and protrudes from the upper surface 51a. In this embodiment, the plurality of bonding members 22 are bonded to one pad wiring layer 29. Referring to FIG. 17, the plurality of bonding members 22 may be arranged at intervals from each other in the longitudinal direction of the pad wiring layer 29.

The bonding member 22 has a laminated structure including a barrier layer 17 and a Cu columnar body 18 containing metal including copper as a main component and formed on the main surface of the barrier layer 17. Here, the phrase "metal including copper as a main component" constituting the Cu columnar body 18 is the same as the definition of the Cu conductive layer 49 described above. The barrier layer 17 is mechanically and electrically connected to the pad wiring layer 29. The barrier layer 17 may have a thickness of 100 nm or more and 500 nm or less (about 100 nm in this embodiment). The barrier layer 17 may have a single-layer structure including a single metal layer. The barrier layer 17 may have a laminated structure in which a plurality of metal layers are laminated.

The Cu columnar body 18 may have a thickness of 20 μm or more and 60 μm or less. Further, in the columnar body 222, a columnar body made of a material other than Cu may be applied instead of the Cu columnar body 18. The bonding layer 30 is formed on the front end surface 222A of the columnar body 222 of the bonding member 22. The bonding layer 30 has a protrusion 19 that partially protrudes laterally from the side surface 222B of the columnar body 222.

The bonding layer 30 may have a layer made of a material having a linear expansion coefficient smaller than the linear expansion coefficient of the Cu columnar body 18 at a portion in contact with the Cu columnar body 18. In this embodiment, the bonding layer 30 has a laminated structure including a first layer 24 formed on the columnar body 222 (the Cu columnar body 18) and a second layer 25 formed on the first layer 24. The first layer 24 is made of a material having a linear expansion coefficient smaller than that of the Cu columnar body 18. More specifically, the first layer 24 may include a nickel layer, and the second layer 25 may include a solder layer.

The nickel layer may be metal having the mass ratio (mass %) of nickel higher than that of any other component constituting the nickel layer. In other words, the first layer 24 may be metal including nickel as a main component. The solder layer is preferably a lead-free solder containing zero or little lead. For example, various materials such as SnAgCu-based, SnZnBi-based, SnCu-based, SnAgInBi-based, and SnZnAl-based materials may be applied as the lead-free solder. Further, as shown in FIG. 18, the second layer 25 may be formed in substantially a spherical shape before flip-chip bonding.

Figure 23B:
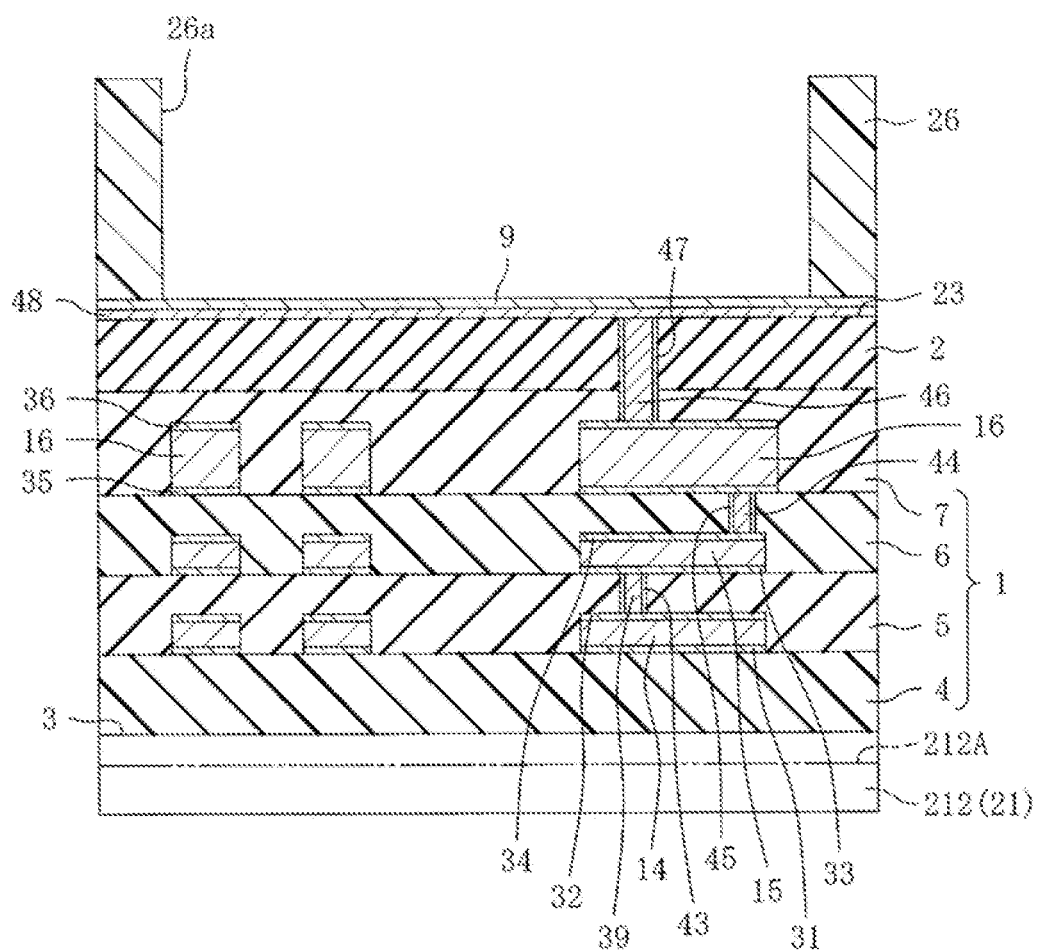
FIG. 23B is a view showing the next step of FIG. 23A.
Figure 23C:
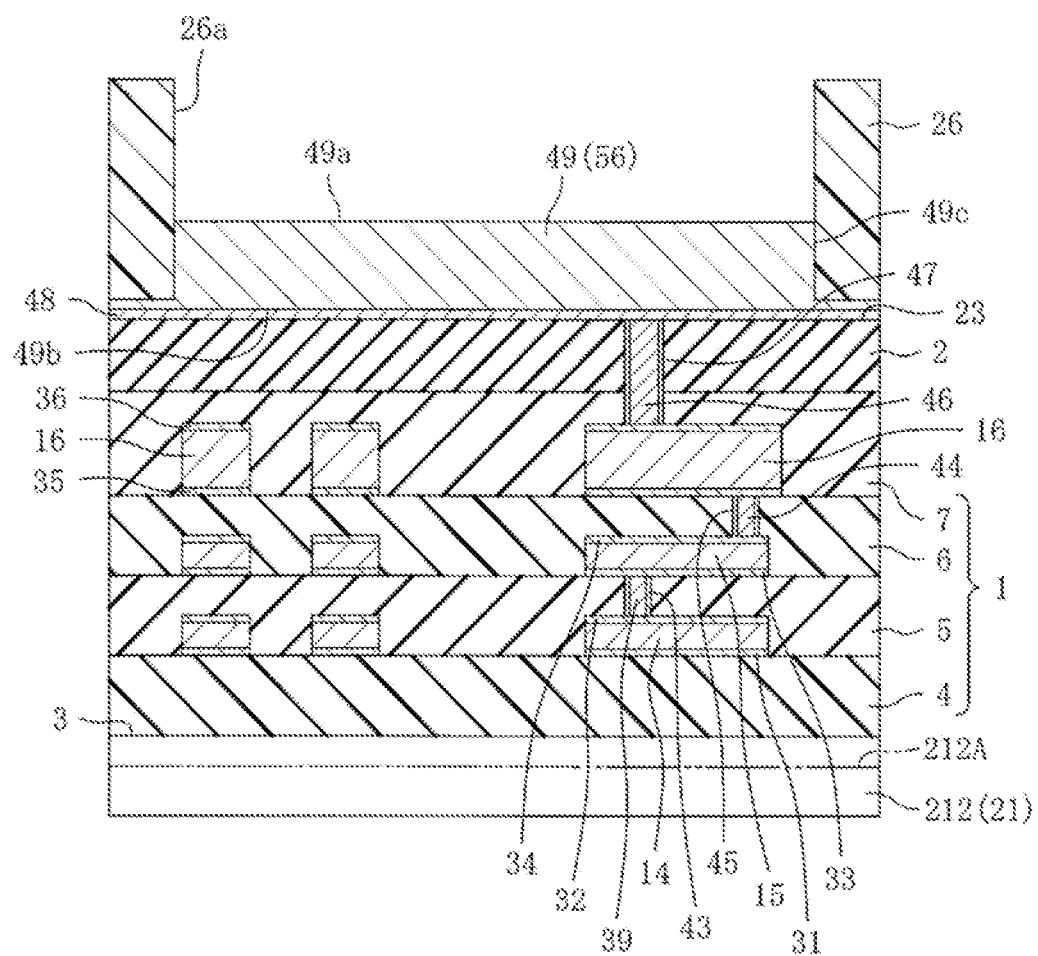
FIG. 23C is a view showing the next step of FIG. 23B.
Figure 23D:
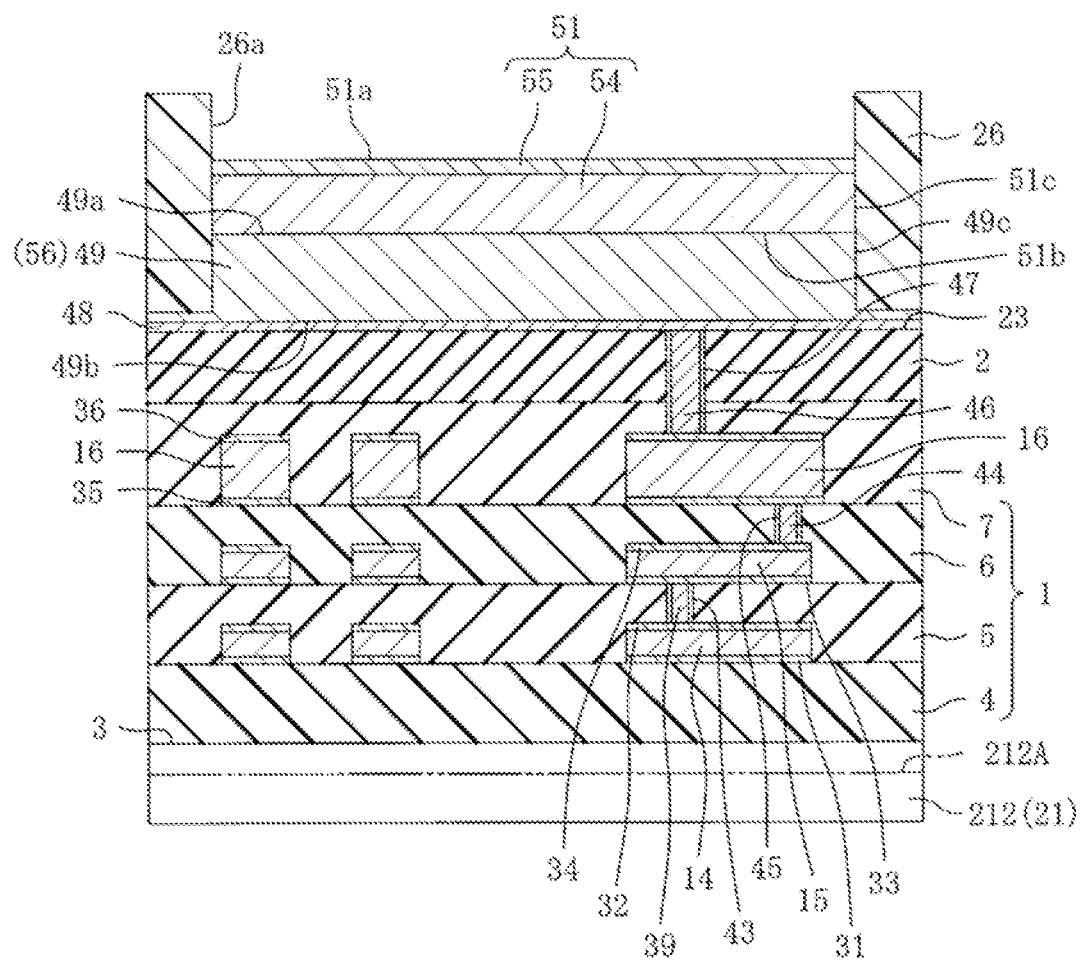
FIG. 23D is a view showing the next step of FIG. 23C.
Figure 23E:
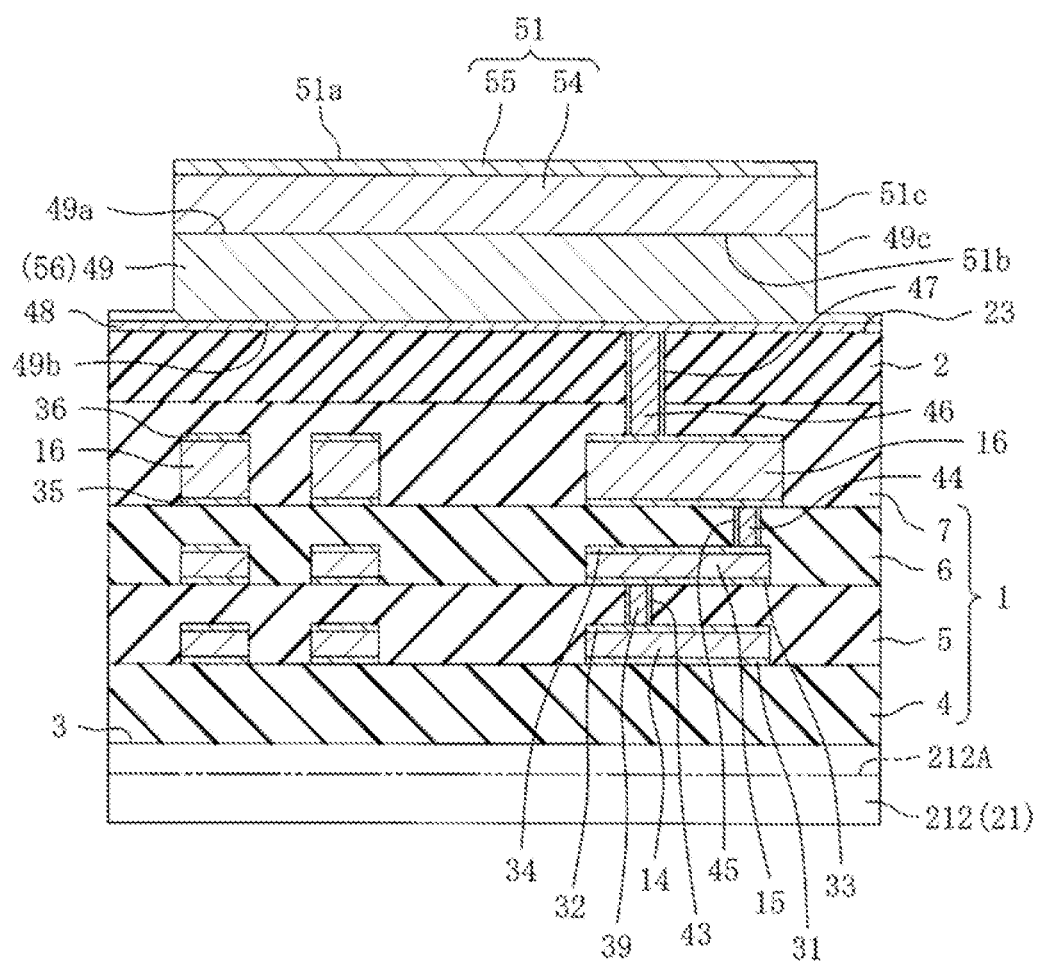
FIG. 23E is a view showing the next step of FIG. 23D.
Figure 23F:
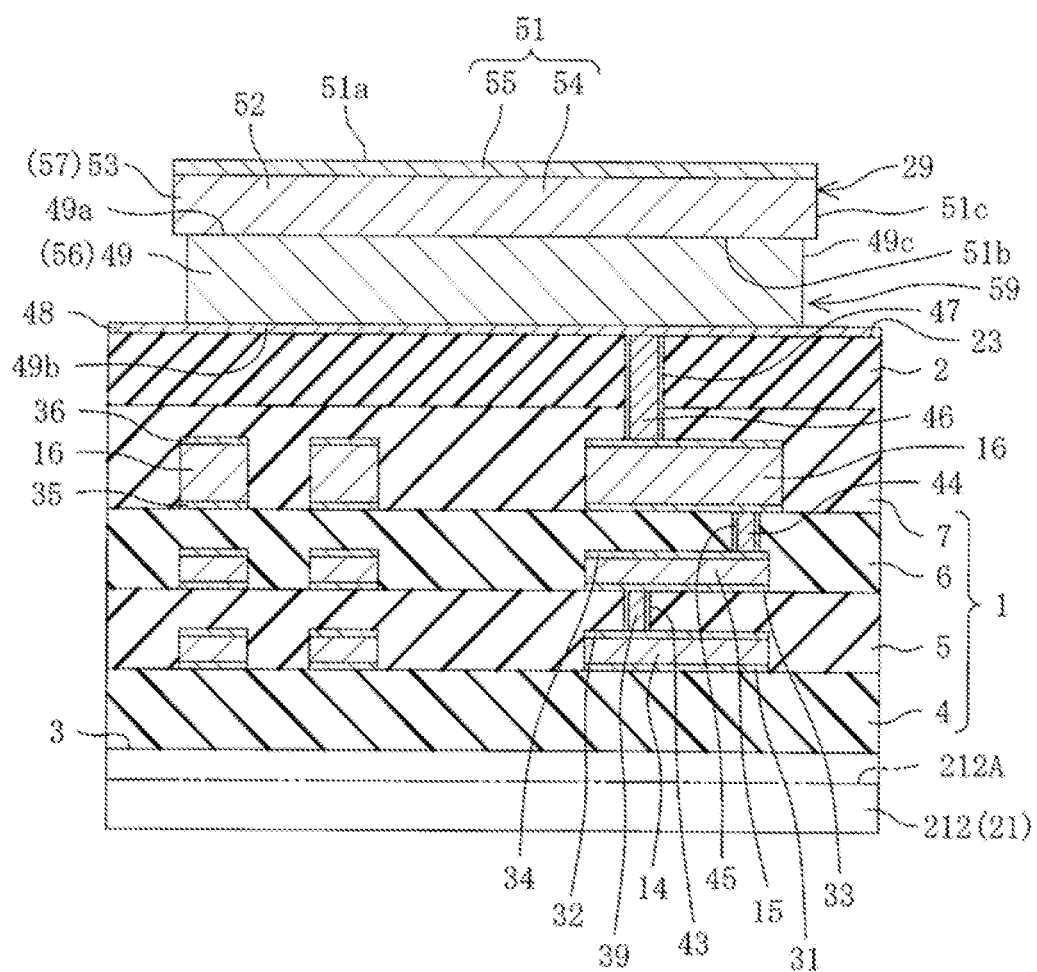
FIG. 23F is a view showing the next step of FIG. 23E.
Figure 23G:
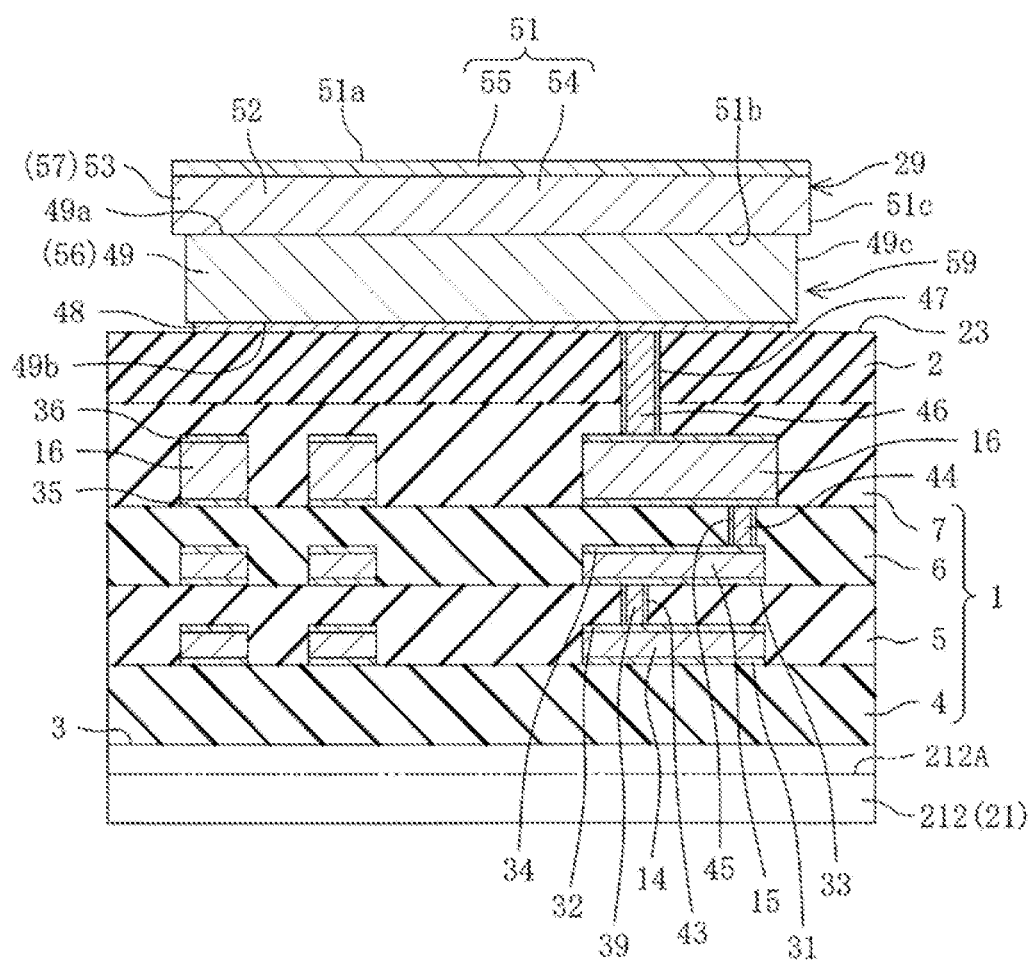
FIG. 23G is a view showing the next step of FIG. 23F.
Figure 23H:
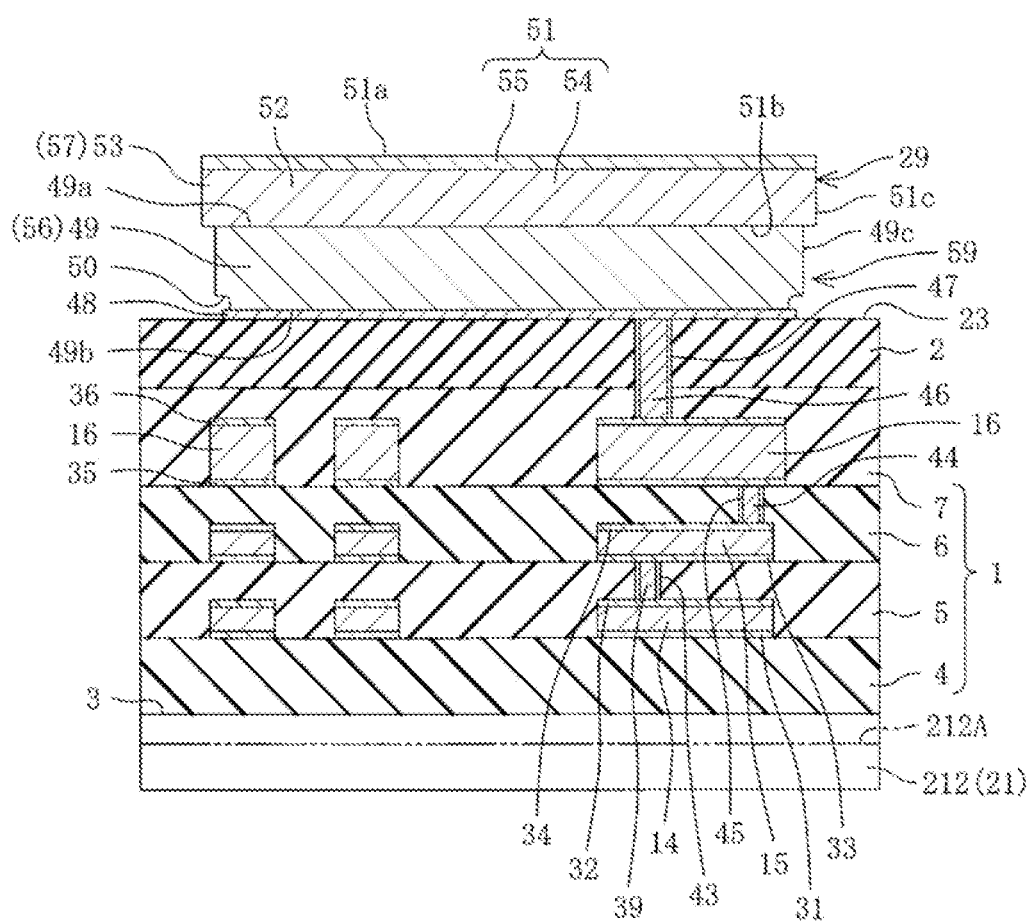
FIG. 23H is a view showing the next step of FIG. 23G.
Figure 23I:
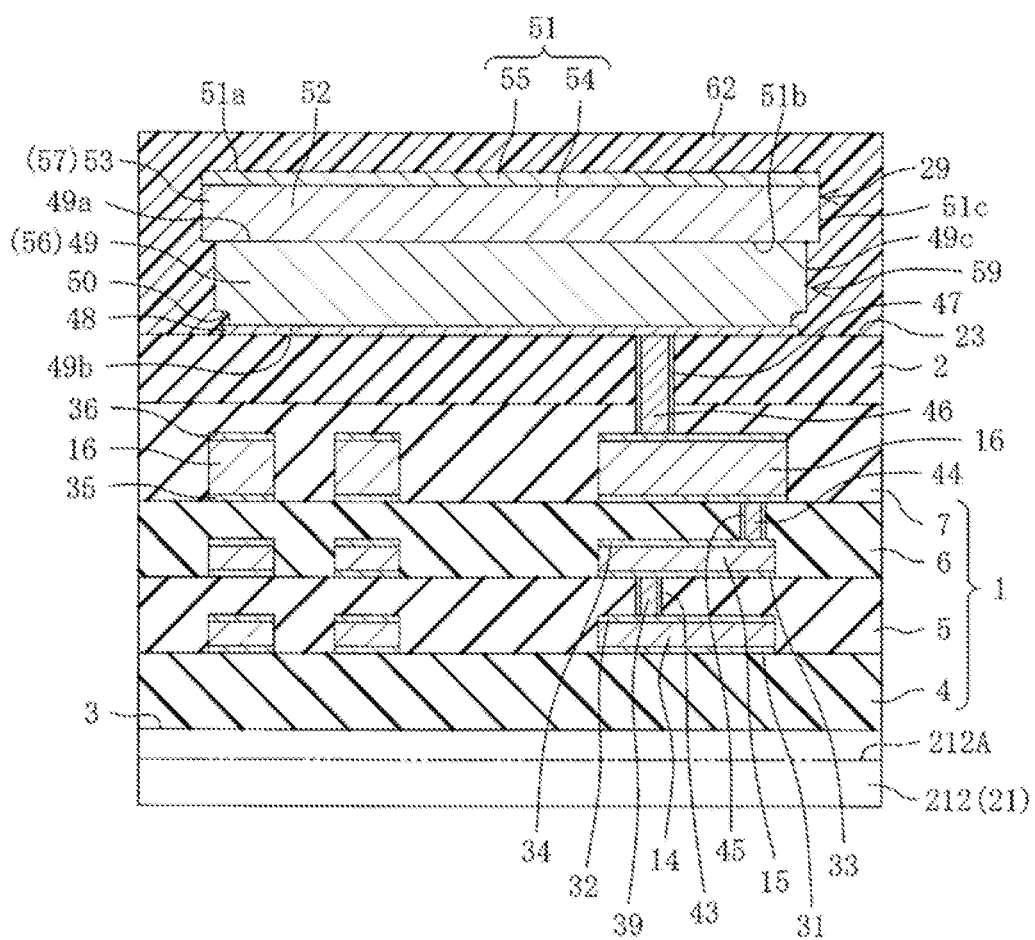
FIG. 23I is a view showing the next step of FIG. 23H.
Figure 23J:
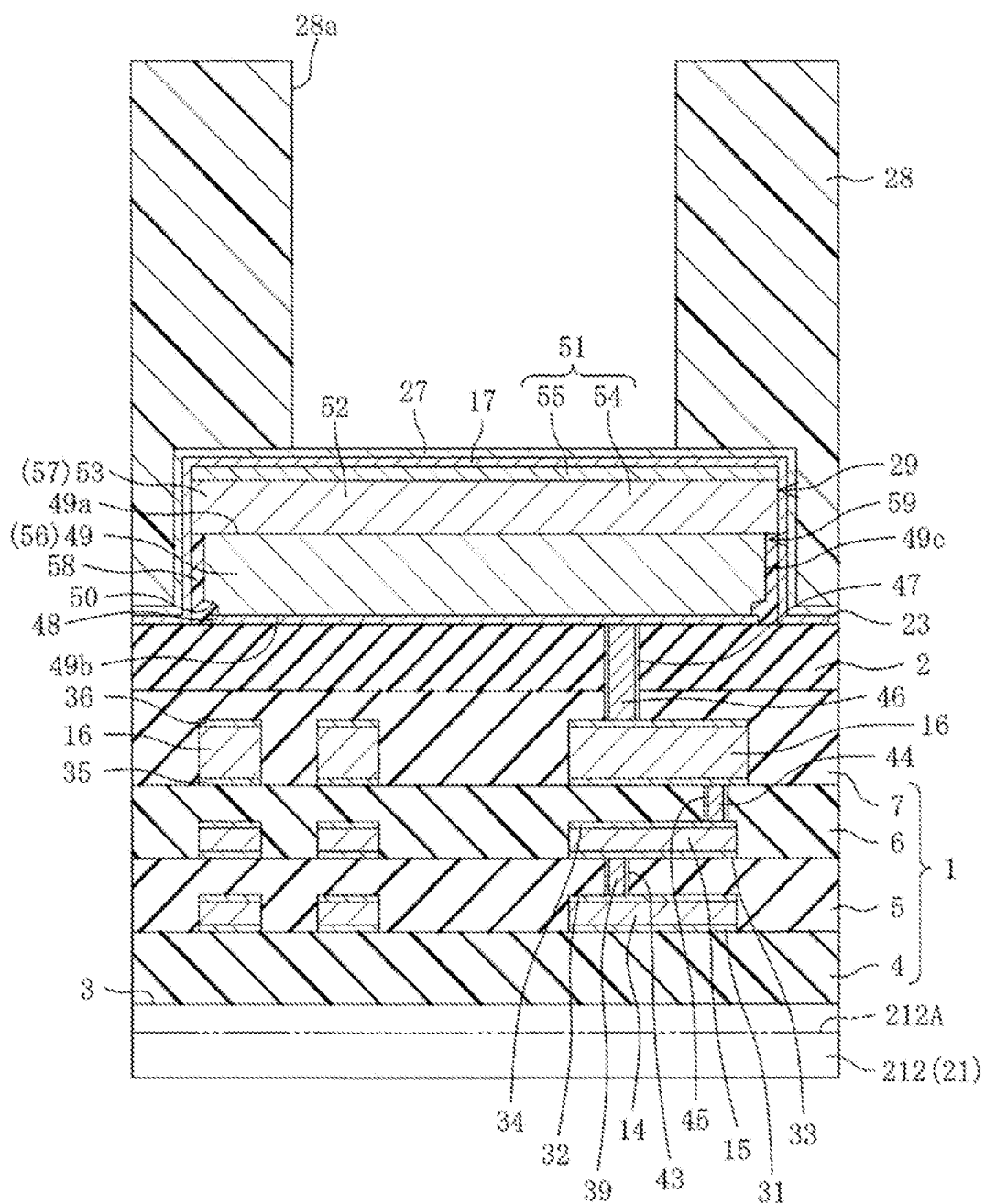
FIG. 23J is a view showing the next step of FIG. 23I.
Figure 23K:
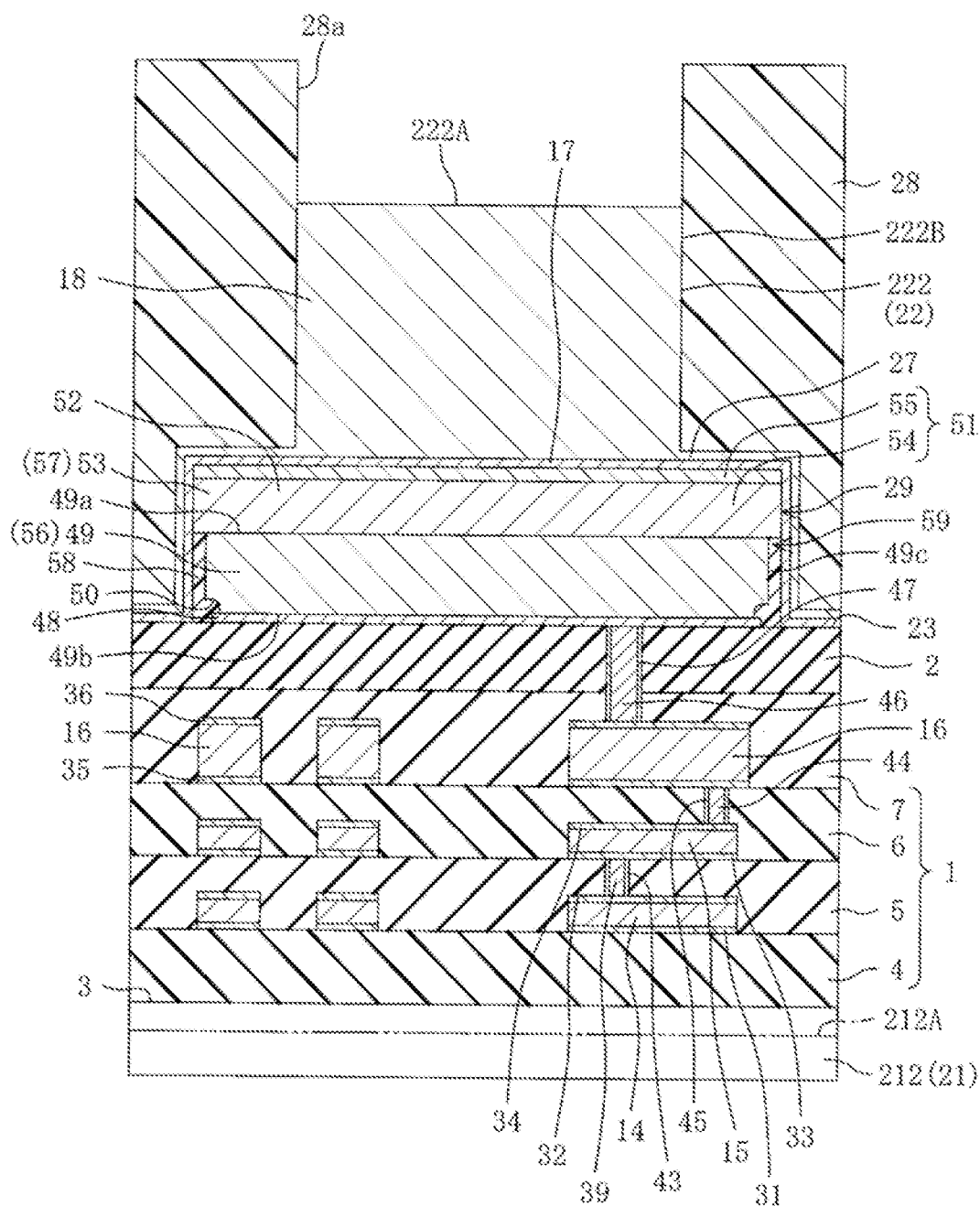
FIG. 23K is a view showing the next step of FIG. 23J.
Figure 23L:
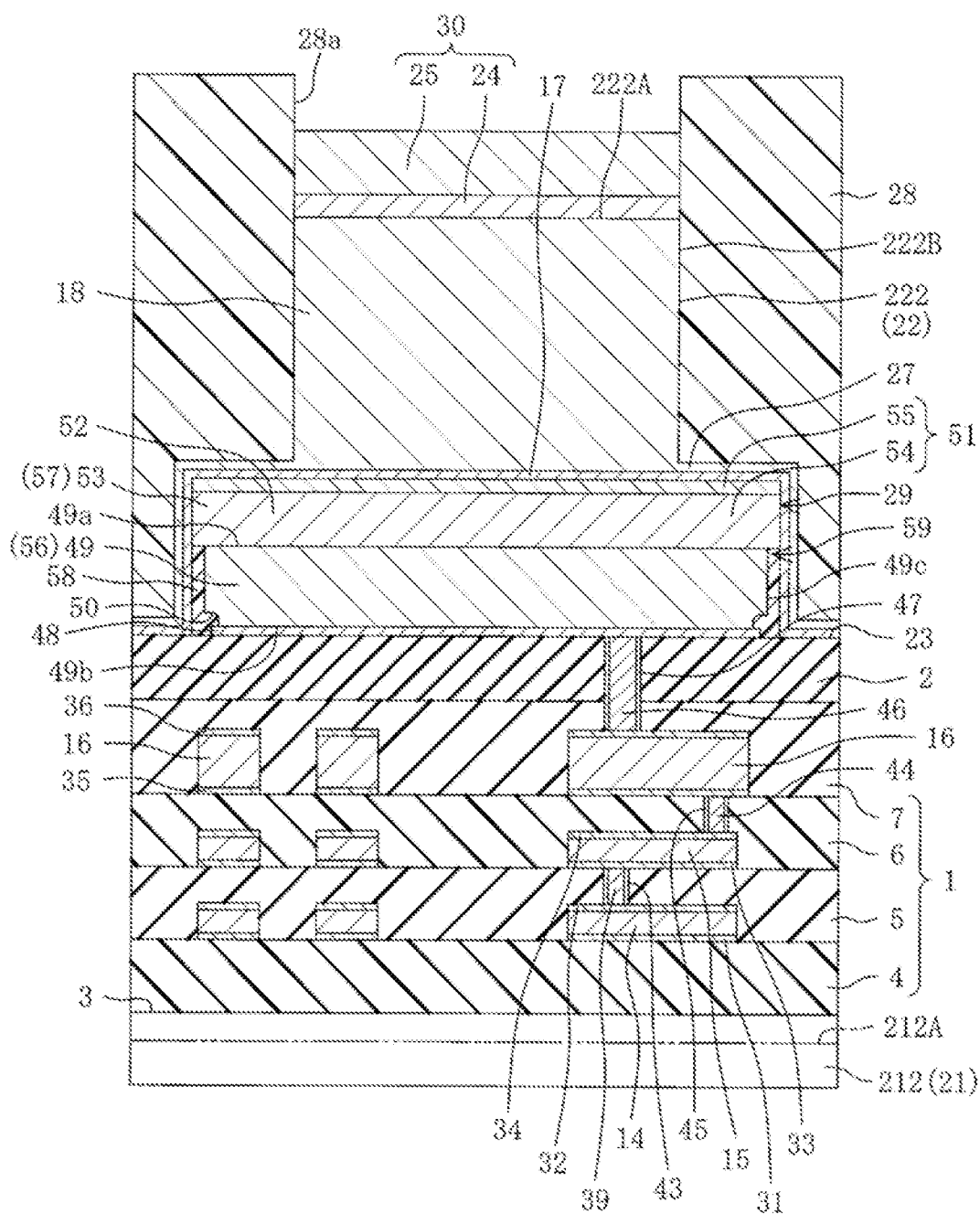
FIG. 23L is a view showing the next step of FIG. 23K.
Figure 23M:
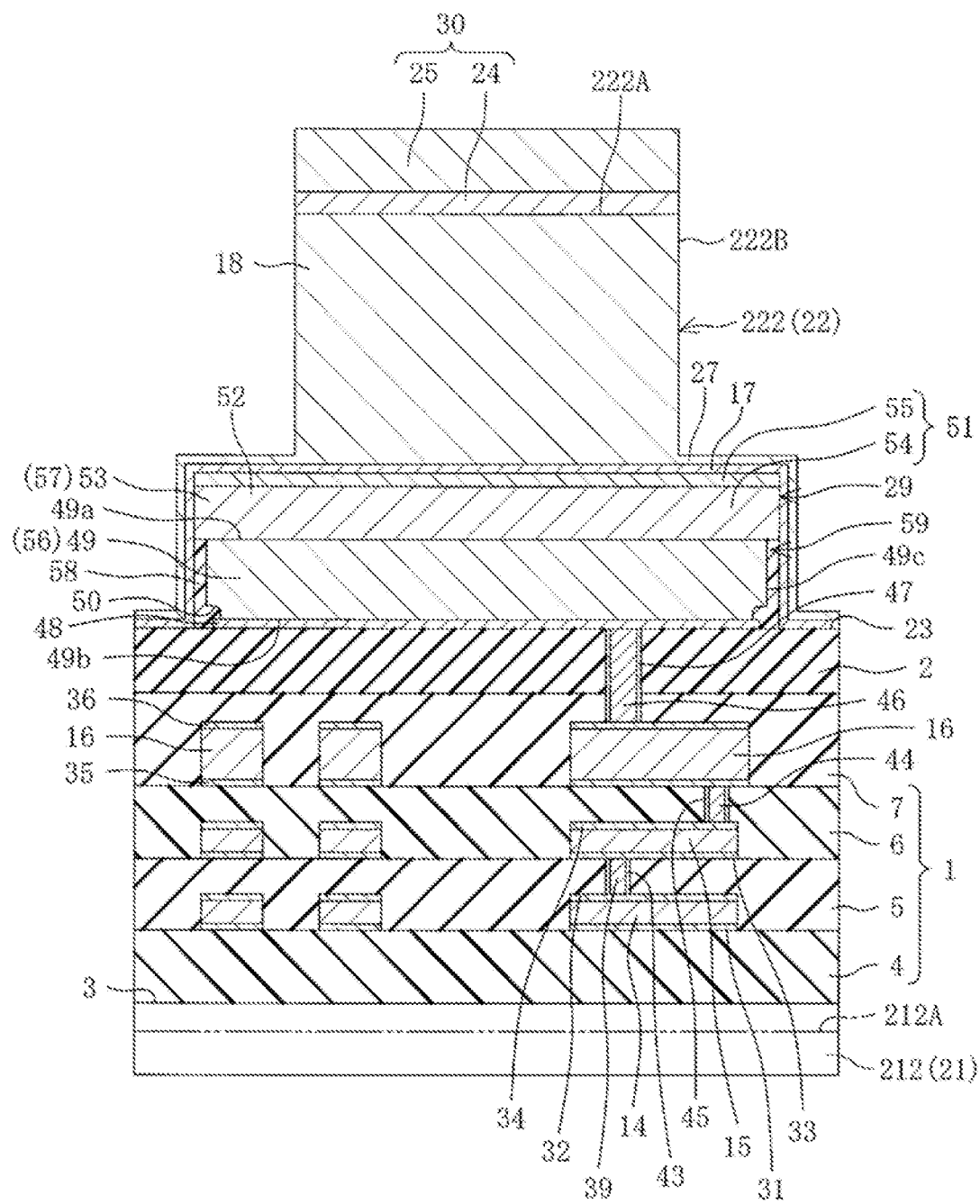
FIG. 23M is a view showing the next step of FIG. 23L.
Figure 23N:
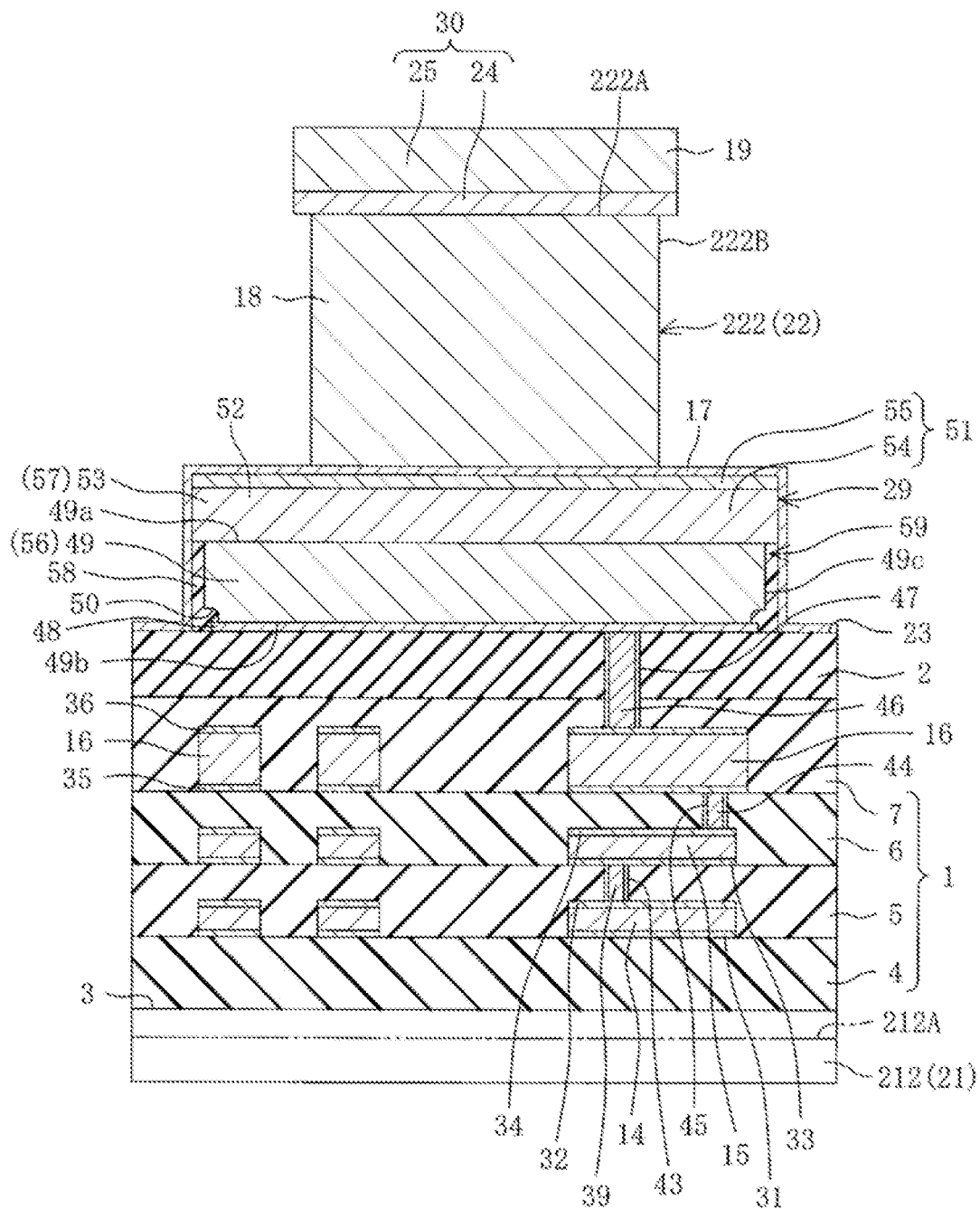
FIG. 23N is a view showing the next step of FIG. 23M.
Figure 23O:
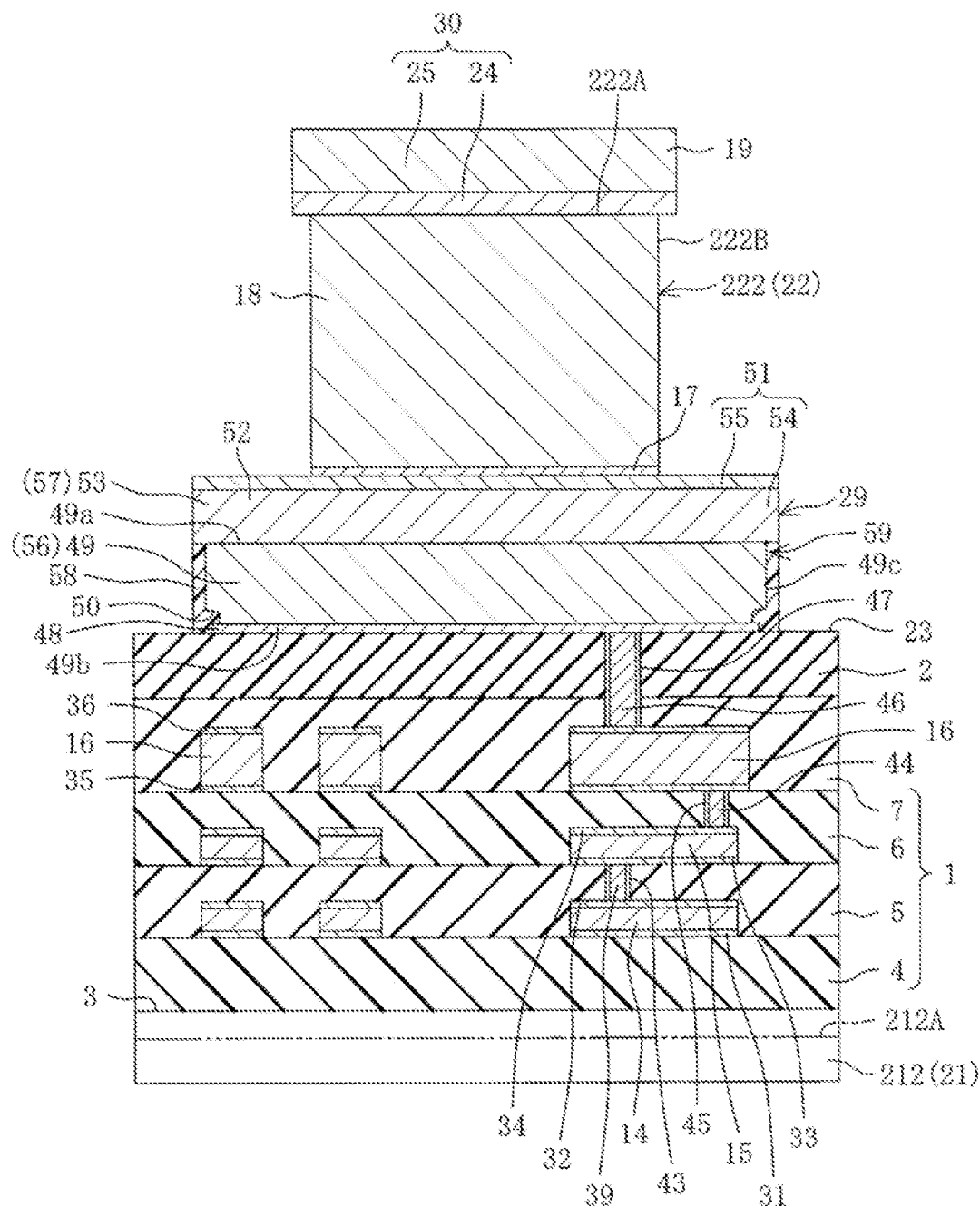
FIG. 23O is a view showing the next step of FIG. 23N.
Figure 23P:
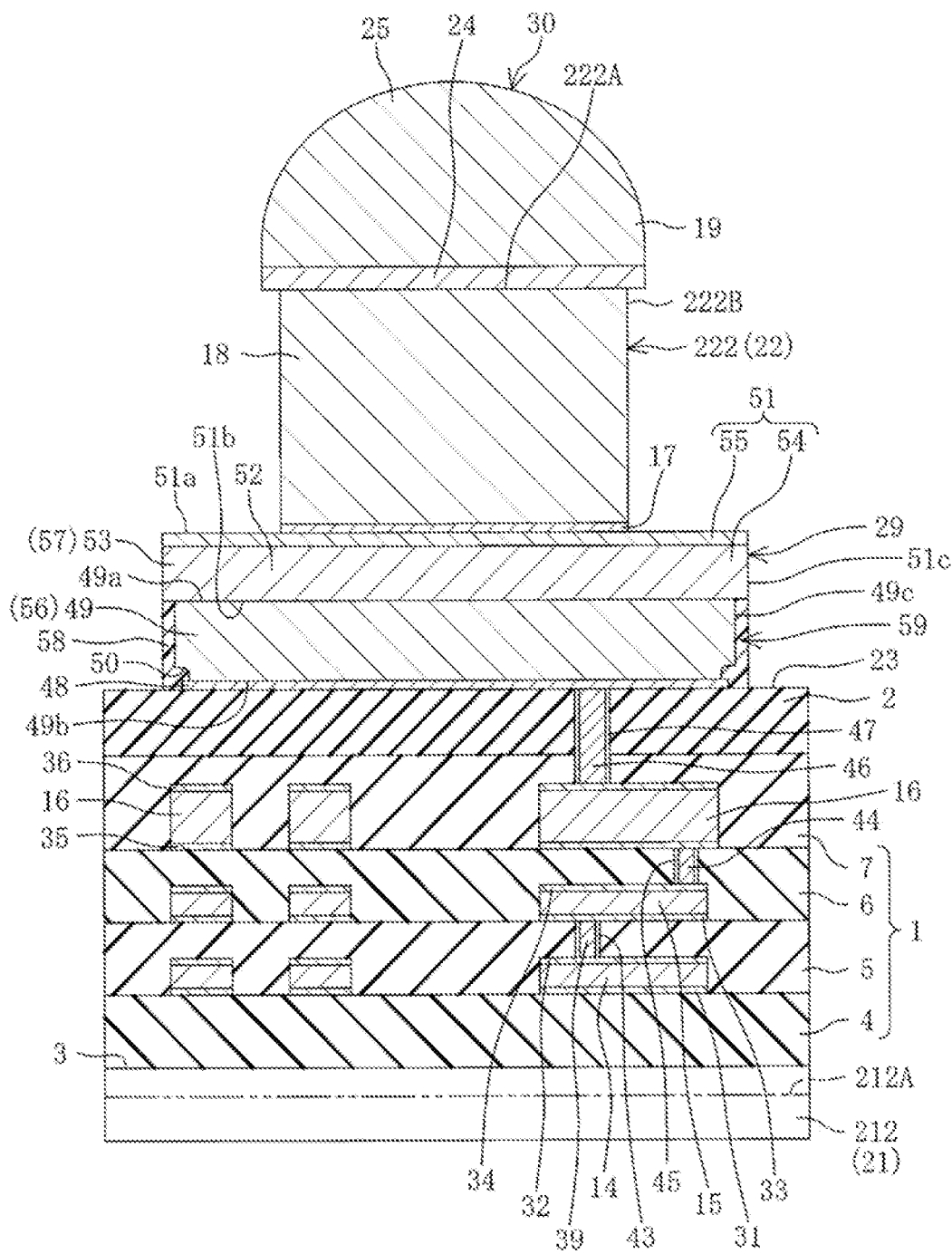
FIG. 23P is a view showing the next step of FIG. 23O.
Figure 24A:
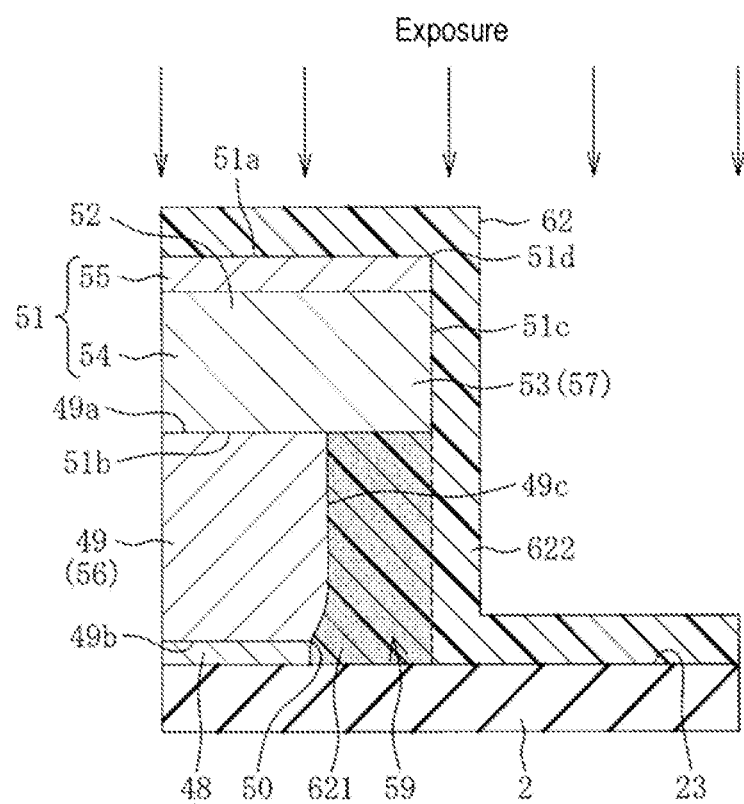
FIGS. 24A and 24B are views showing steps related to formation of a coating insulating film.
Figure 24B:
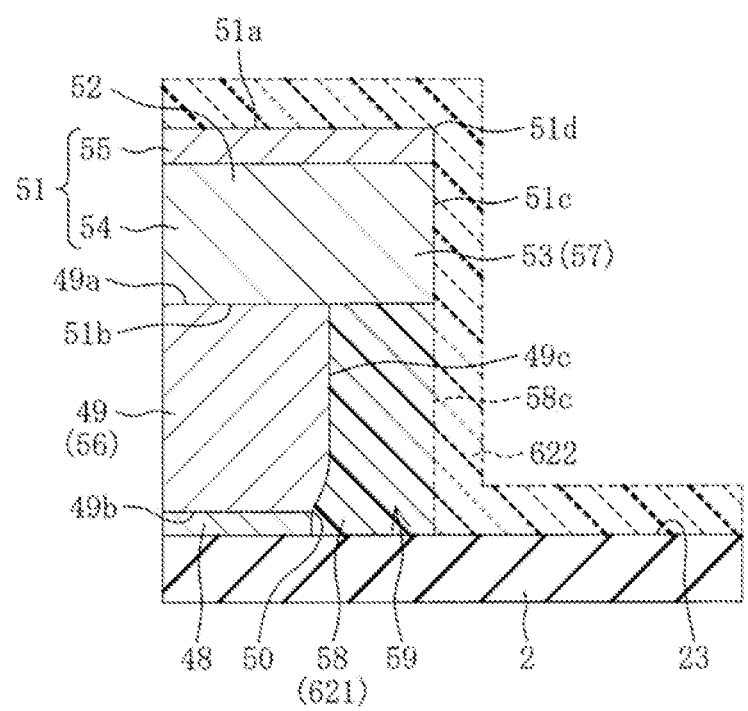
Figure 25A:
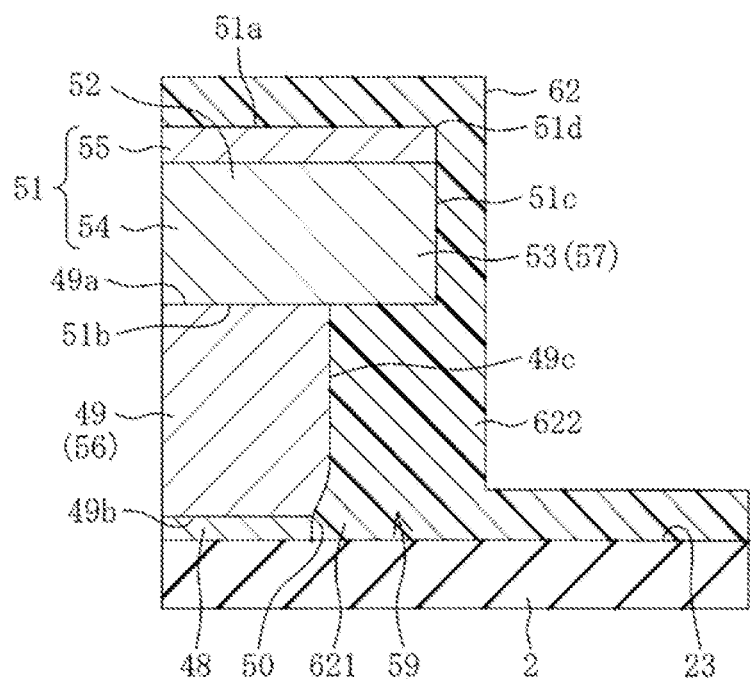
FIGS. 25A and 25B are views showing steps related to formation of the coating insulating film.
Figure 25B:
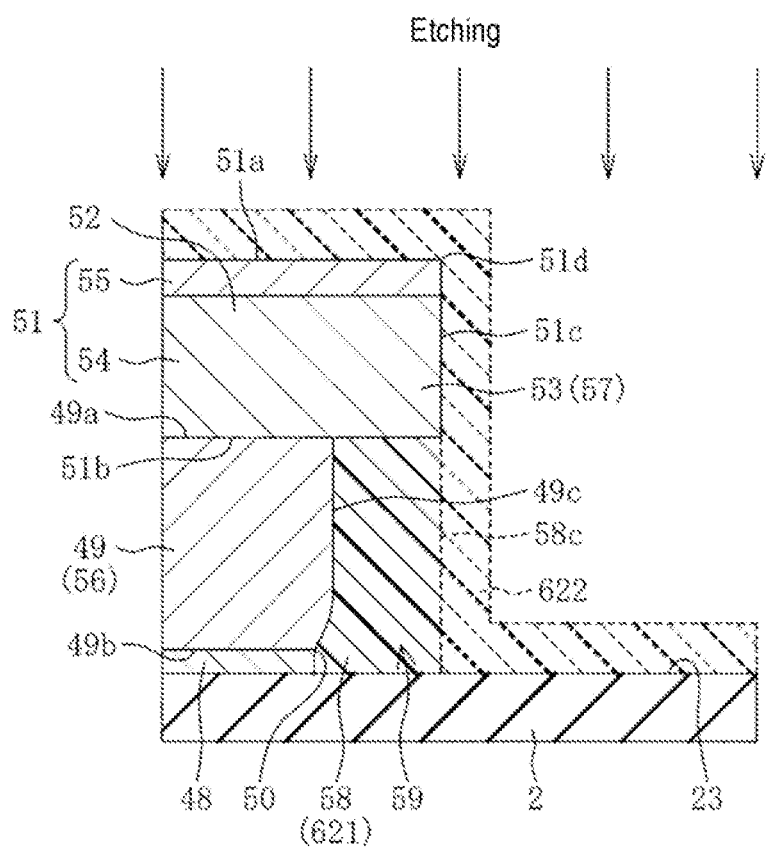

FIGS. 23A to 23P are views for explaining parts of a process of manufacturing the semiconductor device A10 in process order. FIGS. 24A and 24B are views showing steps related to formation of the coating insulating film 58. FIGS. 25A and 25B are views showing steps related to formation of the coating insulating film 58. In the following, a case where the Cu conductive layer 49 is made of high-purity copper will be described as an example. When manufacturing the semiconductor device A10, first, the element chip 20 is manufactured. Referring to FIG. 23A, a wafer-shaped semiconductor substrate (the semiconductor layer 212) in which the passivation layer 2 is formed on the multilayer wiring structure 1 is provided. The third via 46 penetrating the passivation layer 2 and the fourth interlayer insulating film 7 is formed in the passivation layer 2 and the fourth interlayer insulating film 7. Next, the barrier conductive layer 48 is formed on the passivation layer 2. The barrier conductive layer 48 may be formed by, for example, a sputtering method.

Next, referring to FIG. 23B, a Cu seed layer 9 is formed on the barrier conductive layer 48. The Cu seed layer 9 may be formed by, for example, a sputtering method. Next, a mask 26 having a predetermined pattern is formed on the Cu seed layer 9. The mask 26 selectively has an opening 26a, which exposes a region where the Cu conductive layer 49 is to be formed, in the Cu seed layer 9.

Next, referring to FIG. 23C, the Cu conductive layer 49 (the first conductive layer 56) is formed. The Cu conductive layer 49 is formed on the surface of the Cu seed layer 9 exposed from the opening 26a of the mask 26. The Cu conductive layer 49 may be formed by an electrolytic copper plating method. The Cu conductive layer 49 is formed up to the middle portion of the opening 26a of the mask 26 in the depth direction. The Cu conductive layer 49 is formed integrally with the Cu seed layer 9.

Next, referring to FIG. 23D, the first layer 54 and the second layer 55 are formed in this order on the upper surface 49a of the Cu conductive layer 49. The first layer 54 and the second layer 55 are each formed on the upper surface 49a of the Cu conductive layer 49 exposed from the opening 26a of the mask 26. The first layer 54 and the second layer 55 may be each formed by an electroless plating method. Next, referring to FIG. 23E, the mask 26 is removed.

Next, referring to FIG. 23F, an unnecessary portion of the Cu seed layer 9 is removed. The Cu seed layer 9 may be removed by wet etching. In this step, a portion of the Cu conductive layer 49 is side-etched. Therefore, the side surface 49c of the Cu conductive layer 49 is formed so as to be located inward from the side surface of the second conductive layer 51. The side etching is generated, for example, by a battery effect between the first conductive layer 56 and the second conductive layer 51, which are made of different conductive materials. The "battery effect" may be defined as an effect in which, for example, when conductive materials different from each other are immersed in an aqueous solution such as an etching solution in a conductive state, a voltage is generated between both conductive materials, and a material having a relatively low ionization tendency is corroded.

As a result, the second conductive layer 51 is formed. The second conductive layer 51 includes the first portion 52 mechanically and electrically connected to the upper surface 49a of the Cu conductive layer 49, and the second portion 53 (the eaves portion 57) protruding from the first portion 52 to the side of the barrier conductive layer 48. Further, the recess 59 is formed below the eaves portion 57. Next, referring to FIG. 23G, an unnecessary portion of the barrier conductive layer 48 is removed. The barrier conductive layer 48 may be removed by wet etching. In this step, the barrier conductive layer 48 located directly under the Cu conductive layer 49 is removed by an amount corresponding to the thickness of the barrier conductive layer 48. Therefore, the side surface of the barrier conductive layer 48 is formed so as to be located inward of the side surface 49c of the Cu conductive layer 49.

Next, referring to FIG. 23H, a corner portion connecting the lower surface 49b and the side surface 49c in the Cu conductive layer 49 is removed. The corner portion of the Cu conductive layer 49 may be removed by wet etching. The wet etching step is performed until the main surface of the barrier conductive layer 48 is exposed. As a result, the recess 50 to expose the upper surface of the edge portion of the barrier conductive layer 48 is formed in a region of the Cu conductive layer 49 on the lower surface 49b side of the side surface 49c.

Next, referring to FIGS. 23I, 24A, and 25A, an insulating layer 62 is formed on the passivation layer 2 so as to cover the pad wiring layer 29. The insulating layer 62 may be a photosensitive resin layer (for example, a polyimide resin film, a phenol resin film, or the like) or may be an insulating layer (for example, a silicon oxide film, a silicon nitride film, or the like) other than the resin layer. The insulating layer 62 may be formed on the entire surface of a semiconductor wafer (the semiconductor layer 212) by, for example, a spin coating method. A portion of the insulating layer 62 enters the recess 59 as a first portion 621 (a portion painted in gray in FIG. 24A), and the rest of the insulating layer 62 is exposed outside the recess 59 as a second portion 622.

When the insulating layer 62 is a resin layer, referring to FIG. 24A, the entire surface of the insulating layer 62 is exposed. At this time, the first portion 621 of the insulating layer 62 is covered with the eaves portion 57 so as not to be exposed and becomes a non-photosensitive portion. On the other hand, since the second portion 622 of the insulating layer 62 is not covered with the eaves portion 57, it is exposed and becomes a photosensitive portion. That is, the eaves portion 57 of the second conductive layer 51 is used as a mask configured to prevent the first portion 621 of the insulating layer 62 from being exposed to light. Next, referring to FIG. 24B, by developing the insulating layer 62 after the exposure, the first portion 621, which is the non-photosensitive portion of the insulating layer 62, is left as the coating insulating film 58, and the second portion 622, which is the photosensitive portion of the insulating layer 62, is selectively removed.

On the other hand, as shown in FIGS. 25A and 25B, the patterning of the insulating layer 62 may be performed by etch-back. For example, the insulating layer 62 may be formed on the entire surface of the semiconductor wafer (the semiconductor layer 212) and then may be subjected to anisotropic etch-back. In this case, the first portion 621 of the insulating layer 62 is hidden by the eaves portion 57 in the normal direction with respect to the upper surface 23 so as not to be exposed to the etching solution, and may be left as the coating insulating film 58.

Next, referring to FIG. 23J, the barrier layer 17 is formed on the passivation layer 2 so as to cover the pad wiring layer 29. The barrier layer 17 may be formed by, for example, a sputtering method. Next, a Cu seed layer 27 is formed on the barrier layer 17. The Cu seed layer 27 may be formed by, for example, a sputtering method. Next, a mask 28 having a predetermined pattern is formed on the Cu seed layer 27. The mask 28 selectively has an opening 28a, which exposes a region where the Cu columnar body 18 is to be formed, in the Cu seed layer 27.

Next, referring to FIG. 23K, the Cu columnar body 18 is formed. The Cu columnar body 18 is formed on the surface of the Cu seed layer 27 exposed from the opening 28a of the mask 28. The Cu columnar body 18 may be formed by an electrolytic copper plating method. The Cu columnar body 18 is formed up to the middle portion of the opening 28a of the mask 28 in the depth direction. Next, referring to FIG. 23L, the first layer 24 (nickel layer) is formed on the Cu columnar body 18. The first layer 24 is formed on the upper surface of the Cu columnar body 18 exposed from the opening 28a of the mask 28. The first layer 24 may be formed by an electroless plating method. Next, the second layer 25 (solder layer) is formed on the first layer 24. As a result, the bonding layer 30 is formed.

Next, referring to FIG. 23M, the mask 28 is removed. Next, referring to FIG. 23N, an unnecessary portion of the Cu seed layer 27 is removed. The Cu seed layer 27 may be removed by wet etching. In this step, a portion of the Cu columnar body 18 is side-etched. Therefore, the side surface 222B of the Cu columnar body 18 is formed so as to be located inward from the side surface of the first layer 24.

Next, referring to FIG. 23O, an unnecessary portion of the barrier layer 17 is removed. The barrier layer 17 may be removed by wet etching. Next, referring to FIG. 23P, the second layer 25 is formed into a spherical shape by, for example, heat treatment. After that, the element chip 20 is flip-bonded to the conductive member 10. Next, the element chip 20 is sealed with the sealing resin 40, together with the conductive member 10. Then, a step of dicing the sealing resin 40 is carried out to cut out the semiconductor device A10. Through the above steps, the semiconductor device A10 is manufactured.

As described above, in this element chip 20, as shown in FIGS. 18 to 22, since the side surface 49c of the first conductive layer 56 is covered with the coating insulating film 58, it is possible to suppress ions caused by Cu from moving along the upper surface 23 of the passivation layer 2. As a result, it is possible to suppress ion migration in the peripheral region 60 of the pad wiring layer 29. More specifically, it is possible to suppress the movement of ions in the region 61 between the adjacent pad wiring layers 29, that is, the ion migration.

On the other hand, the coating insulating film 58 is selectively formed below the eaves portion 57 of the pad wiring layer 29. Therefore, the upper surface 51a of the pad wiring layer 29 and the upper portion of the side surface 51c of the pad wiring layer 29 in the vicinity of the upper surface 51a are not covered with the coating insulating film 58. As a result, it is possible to reduce a covering portion of the pad wiring layer 29 by the coating insulating film 58, thereby reducing a stress on the pad wiring layer 29.

Figure 26:
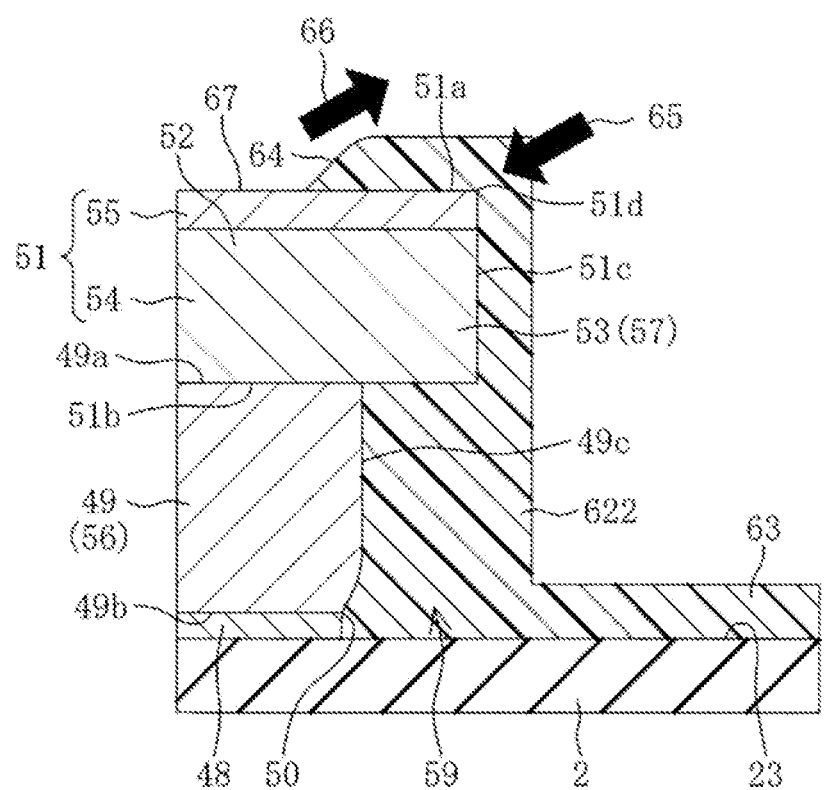
FIG. 26 is a schematic cross-sectional view showing a reference example of the element chip.

For example, as in a reference example of FIG. 26, a case where the upper surface 51a and the side surface 51c of the pad wiring layer 29 are covered with a resin film 63 and a contact hole 64 of the bonding member 22 is formed in the resin film 63 is compared. In this reference example, since the pad wiring layer 29 is covered with the resin film 63, a stress is likely to be applied in directions indicated by arrows 65 and 66, for example, in the vicinity of the boundary portion 51d and the contact hole 64. Further, since an adhesion between Ni/Pd and the resin is poor, there is a concern that the resin film 63 may peel off due to this stress. On the other hand, in this embodiment, since the upper surface 51a and the side surface 51c of the pad wiring layer 29 are exposed from the coating insulating film 58, it is possible to eliminate at least the stress indicated by the arrows 65 and 66 in FIG. 26.

Further, in the element chip 20 according to this embodiment, the entire upper surface 51a of the pad wiring layer 29 is exposed from the coating insulating film 58. Therefore, the bonding member 22 can be bonded to the upper surface 51a under a condition (for example, a dimensional condition, a misalignment condition, etc.), which is more relaxed than that in the case where only a portion of the upper surface 51a of the pad wiring layer 29 is exposed as a pad 67 from the contact hole 64 as shown in FIG. 26.

Figure 27:
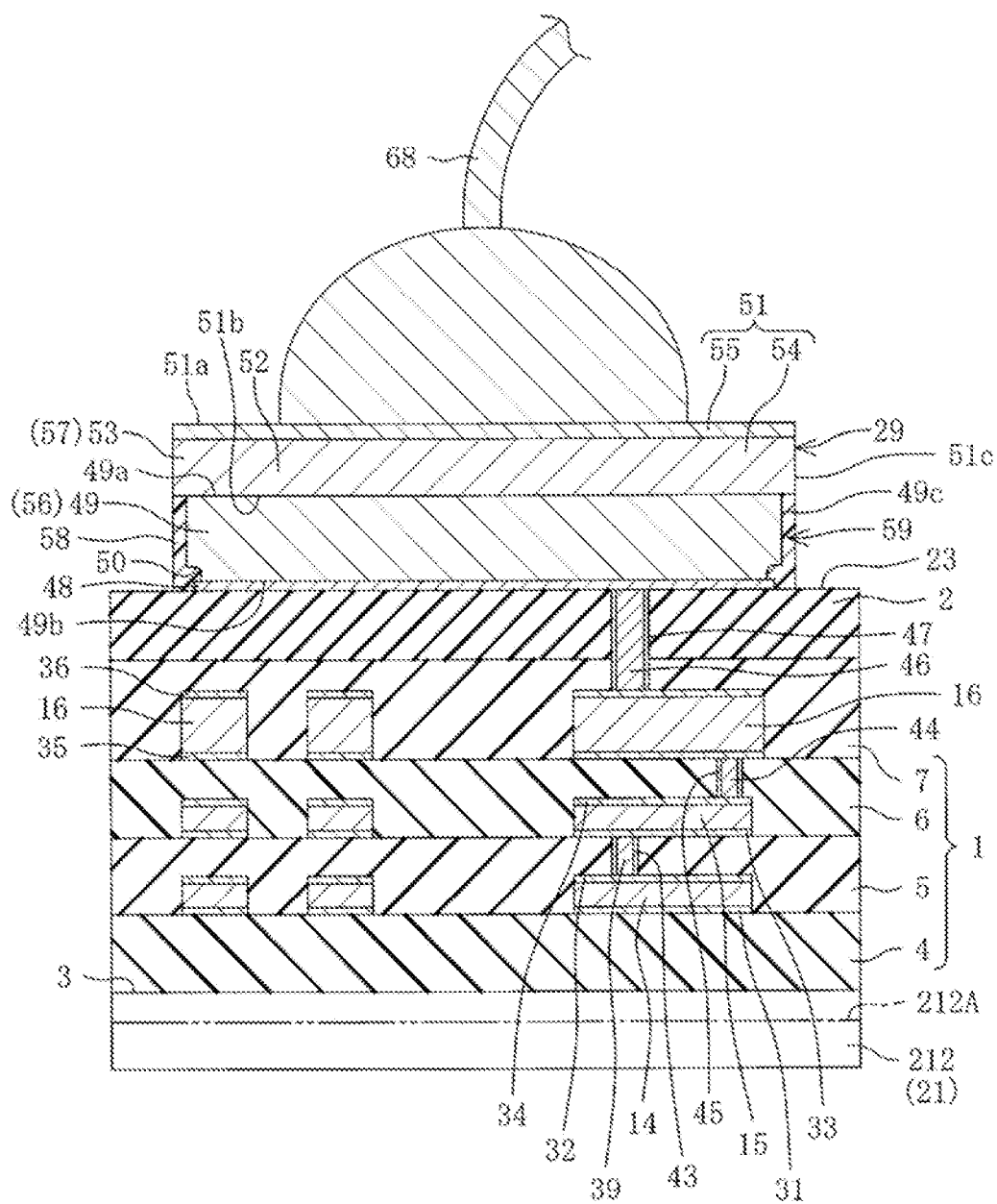
FIG. 27 is a schematic cross-sectional view showing another form of the element chip.

Further, when the coating insulating film 58 selectively buried in the recess 59 is formed, the eaves portion 57 of the pad wiring layer 29 is used as a mask at the time of patterning the insulating layer 62, such that a cost increase due to addition of the mask may be prevented. Although the embodiments of the present disclosure have been described, the present disclosure may also be implemented in other embodiments. For example, in the above-described embodiments, only the form in which the element chip 20 is flip-chip bonded is shown, but in the element chip 20, the back surface of the semiconductor substrate 211 may be bonded to the conductive member 10, and the second conductive layer 51 may be bonded to each lead of the conductive member 10 by wire bonding. In this case, as shown in FIG. 27, a bonding wire 68 may be bonded to the upper surface 51a of the pad wiring layer 29.

As described above, the embodiments of the present disclosure are exemplary in all respects and should not be construed in a limited manner, and are intended to include changes in all respects.

The following characteristics of Supplementary Notes may be derived from the description of the present disclosure and the drawings.

Supplementary Note 1-1

A semiconductor device (A10) including:
a semiconductor chip (21) having an element forming surface (3);
an insulating layer (2) formed on the element forming surface (3) of the semiconductor chip (21);
a pad wiring layer (29) including a first conductive layer (49, 56) formed on the insulating layer (2) and containing a first conductive material, and a second conductive layer (51, 54, 55) formed on the first conductive layer (49, 56) and containing a second conductive material different from the first conductive material, wherein the second conductive layer (51, 54, 55) includes an eaves portion (57) protruding outward with respect to an end surface (49c) of the first conductive layer (49, 56);
a bonding member (22) that is bonded to the pad wiring layer (29) and supplies electric power to an element (212A, 212B) of the element forming surface (3); and
a coating insulating film (58) that is selectively formed on the insulating layer (2) below the eaves portion (57), exposes an upper surface (23) of the insulating layer (2) to a peripheral region (60) of the pad wiring layer (29), and covers the end surface (49c) of the first conductive layer (49, 56).

With this configuration, since the end surface (49c) of the first conductive layer (49, 56) is covered with the coating insulating film (58), it is possible to suppress ions caused by the first conductive material from moving along the upper surface (23) of the insulating layer (2). As a result, it is possible to suppress ion migration in the peripheral region (60) of the pad wiring layer (29). On the other hand, the coating insulating film (58) is selectively formed below the eaves portion (57) of the pad wiring layer (29). Therefore, the upper surface (51a) of the pad wiring layer (29) and the upper portion of the end surface (51c) of the pad wiring layer (29) in the vicinity of the upper surface (51a) are not covered with the coating insulating film (58). As a result, it is possible to reduce a covering portion of the pad wiring layer (29) by the coating insulating film (58), thereby reducing a stress on the pad wiring layer (29).

Supplementary Note 1-2

The semiconductor device (A10) of Supplementary Note 1-1, wherein the eaves portion (57) is formed in an annular shape along an outer periphery of the pad wiring layer (29) in a plan view, and
wherein the coating insulating film (58) includes an annular insulating film (58) that is formed over the entire circumference of a recess (59) below the annular eaves portion (57) and laterally covers the first conductive layer (49, 56).

With this configuration, the end surface (49c) of the first conductive layer (49, 56) is covered over the entire circumference of the recess (59). As a result, it is possible to suppress ion migration over the entire circumference of the peripheral region (60) of the pad wiring layer (29).

Supplementary Note 1-3

The semiconductor device (A10) of Supplementary Note 1-1 or 1-2, including: a plurality of pad wiring layers (29) arranged at intervals from each other on the insulating layer (2),
wherein the peripheral region (60) of the pad wiring layer (29) includes a region (61) between adjacent pad wiring layers (29).

With this configuration, it is possible to suppress the movement of ions between adjacent pad wiring layers (29), that is, the ion migration.

Supplementary Note 1-4

The semiconductor device (A10) of any one of Supplementary Notes 1-1 to 1-3, wherein the second conductive layer (51, 54, 55) has a bonding surface (51a) to which the bonding member (22) is bonded and which is an exposed surface entirely exposed from the coating insulating film (58).

With this configuration, the entire bonding surface (51a) of the second conductive layer (51, 54, 55) is exposed from the coating insulating film (58). Therefore, it is possible to prevent a stress from being directly applied from the coating insulating film (58) to at least the bonding surface (51a) of the second conductive layer (51, 54, 55). Further, since the entire bonding surface (51a) of the second conductive layer (51, 54, 55) is exposed, it is possible to bond the bonding member 22 to the bonding surface (51a) under a condition (for example, a dimensional condition, a misalignment condition, etc.), which is more relaxed than that in a case where only a portion of the second conductive layer (51, 54, 55) is exposed as a pad from an opening having a predetermined shape.

Supplementary Note 1-5

The semiconductor device (A10) of any one of Supplementary Notes 1-1 to 1-4, wherein the coating insulating film (58) is substantially hidden below the eaves portion (57) in a plan view.

Supplementary Note 1-6

The semiconductor device (A10) of any one of Supplementary Notes 1-1 to 1-5, wherein the coating insulating film (58) has an end surface (58c) along the end surface (51c) of the second conductive layer (51, 54, 55) in a thickness direction of the pad wiring layer (29).

Supplementary Note 1-7

The semiconductor device (A10) of Supplementary Note 1-6, wherein the end surface (58c) of the coating insulating film (58) is arranged at an inner side of the pad wiring layer (29) than the end surface (51c) of the second conductive layer (51, 54, 55).

Supplementary Note 1-8

The semiconductor device (A10) of Supplementary Note 1-6, wherein the end surface (58c) of the coating insulating film (58) is flush with the end surface (51c) of the second conductive layer (51, 54, 55).

Supplementary Note 1-9

The semiconductor device (A10) of Supplementary Note 1-6, wherein the end surface (58c) of the coating insulating film (58) is arranged at an outer side of the pad wiring layer (29) than the end surface (51c) of the second conductive layer (51, 54, 55).

Supplementary Note 1-10

The semiconductor device (A10) of any one of Supplementary Notes 1-1 to 1-9, wherein the coating insulating film (58) has a first thickness T3) in the thickness direction of the pad wiring layer (29) and a second thickness (T4) in a direction intersecting the thickness direction of the pad wiring layer (29), the second thickness (T4) being smaller than the first thickness (T3).

Supplementary Note 1-11

The semiconductor device (A10) of any one of Supplementary Notes 1-1 to 1-10, wherein the coating insulating film (58) includes a resin film (58).

Supplementary Note 1-12

The semiconductor device (A10) of Supplementary Note 1-11, wherein the resin film (58) includes at least one of a polyimide resin film and a phenol resin film.

Supplementary Note 1-13

The semiconductor device (A10) of any one of Supplementary Notes 1-1 to 1-12, wherein the first conductive layer (49, 56) includes a Cu conductive layer (49), and
wherein the second conductive layer (51, 54, 55) includes a Ni conductive layer (54) on the Cu conductive layer (49), and a Pd conductive layer (55) on the Ni conductive layer (54).

Supplementary Note 1-14

The semiconductor device (A10) of any one of Supplementary Notes 1-1 to 1-13, wherein the bonding member (22) includes a columnar body (222) extending in the thickness direction of the pad wiring layer (29).

Supplementary Note 1-15

The semiconductor device (A10) of any one of Supplementary Notes 1-1 to 1-13, wherein the bonding member (22) includes a bonding wire (68).

Supplementary Note 1-16

The semiconductor device (A10) of any one of Supplementary Notes 1-1 to 1-15, further including:
a conductive member (10) that supports the semiconductor chip (21); and
a sealing resin (40) that covers a portion of the conductive member and the semiconductor chip (21).

Supplementary Note 1-17

A method of manufacturing a semiconductor device (A10), including: forming an insulating layer (2) on an element forming surface (3) of a semiconductor substrate (20);
forming a pad wiring layer (29) by sequentially laminating a first conductive layer (49, 56) containing a first conductive material and a second conductive layer (51, 54, 55) containing a second conductive material different from the first conductive material on the insulating layer (2);
forming, on the pad wiring layer (29), an eaves portion (57) that protrudes outward with respect to an end surface (49c) of the first conductive layer (49, 56) and includes a portion of the second conductive layer (51, 54, 55) by selectively side-etching the first conductive layer (49, 56) of the pad wiring layer (29);
forming a second insulating layer (62) on the insulating layer (2) to cover the pad wiring layer (29); and
leaving a first portion (621) of the second insulating layer (62) covered with the eaves portion (57), as a coating insulating film (58) covering the end surface (49c) of the first conductive layer (49, 56), and selectively removing a second portion (622) of the second insulating layer (62) not covered with the eaves portion (57), by patterning using the eaves portion (57) as a mask.

With this method, the coating insulating film (58) is selectively left below the eaves portion (57) on the insulating layer (2). Further, at least the upper surface (51a) of the pad wiring layer (29) and the upper portion of the end surface (51c) of the pad wiring layer (29) in the vicinity of the upper surface (51a) may be exposed from the coating insulating film (58). As a result, it is possible to provide a semiconductor device (A10) capable of suppressing ion migration in the peripheral region (60) of the pad wiring layer (29) and reducing a stress on the pad wiring layer (29).

Further, since the eaves portion (57) of the pad wiring layer (29) is used as a mask when patterning the second insulating layer (62), it is possible to prevent the cost increase due to the addition of the mask.

Supplementary Note 1-18

The method of Supplementary Note 1-17, wherein the second insulating layer (62) includes a photosensitive resin layer (62), and
wherein the patterning using the eaves portion (57) as the mask includes exposing the entire surface of the resin layer (62) and leaving the first portion (621), which is a non-photosensitive portion of the resin layer (62), as a resin film (58) and selectively removing the second portion (622) which is a photosensitive portion of the resin layer (62), by a development process after the exposure.

Supplementary Note 1-19

The method of Supplementary Note 1-17, wherein the patterning using the eaves portion (57) as the mask includes leaving the first portion (621) of the second insulating layer (62) as the coating insulating film (58) and selectively removing the second portion (622) of the second insulating layer (62), by etching back the second insulating layer (62).

According to the present disclosure in some embodiments, it is possible to provide a semiconductor device capable of suppressing ion migration in a peripheral region of a pad wiring layer and reducing a stress on the pad wiring layer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a semiconductor chip having an element forming surface;
an insulating layer formed on the element forming surface of the semiconductor chip;
a barrier conductive layer formed on the insulating layer;
a pad wiring layer including a first conductive layer formed on the barrier conductive layer and containing a first conductive material and a second conductive layer formed on the first conductive layer and containing a second conductive material different from the first conductive material, wherein the second conductive layer includes an eaves portion protruding outward with respect to an end surface of the first conductive layer;
a bonding member that is bonded to the pad wiring layer and supplies electric power to an element of the element forming surface; and
a coating insulating film that is selectively formed on the insulating layer below the eaves portion, exposes an upper surface of the insulating layer to a peripheral region of the pad wiring layer, and covers the end surface of the first conductive layer,
wherein the coating insulating film coats both an upper surface and a side surface of an end portion of the barrier conductive layer.

2. The semiconductor device of claim 1, wherein the eaves portion is formed in an annular shape along an outer periphery of the pad wiring layer in a plan view, and
wherein the coating insulating film includes an annular insulating film that is formed over an entire circumference of a recess below the annular eaves portion and laterally covers the first conductive layer.

3. The semiconductor device of claim 1, comprising:
a plurality of pad wiring layers arranged at intervals from each other on the insulating layer,
wherein the peripheral region of the pad wiring layer includes a region between adjacent pad wiring layers.

4. The semiconductor device of claim 1, wherein the second conductive layer has a bonding surface to which the bonding member is bonded and which is an exposed surface entirely exposed from the coating insulating film.

5. The semiconductor device of claim 1, wherein the coating insulating film is substantially hidden below the eaves portion in a plan view.

6. The semiconductor device of claim 1, wherein the coating insulating film has an end surface along an end surface of the second conductive layer in a thickness direction of the pad wiring layer.

7. The semiconductor device of claim 6, wherein the end surface of the coating insulating film is arranged at an inner side of the pad wiring layer than the end surface of the second conductive layer.

8. The semiconductor device of claim 6, wherein the end surface of the coating insulating film is flush with the end surface of the second conductive layer.

9. The semiconductor device of claim 6, wherein the end surface of the coating insulating film is arranged at an outer side of the pad wiring layer than the end surface of the second conductive layer.

10. The semiconductor device of claim 1, wherein the coating insulating film has a first thickness in a thickness direction of the pad wiring layer and a second thickness in a direction intersecting the thickness direction of the pad wiring layer, the second thickness being smaller than the first thickness.

11. The semiconductor device of claim 1, wherein the coating insulating film includes a resin film.

12. The semiconductor device of claim 11, wherein the resin film includes at least one of a polyimide resin film and a phenol resin film.

13. The semiconductor device of claim 1, wherein the first conductive layer includes a Cu conductive layer, and
wherein the second conductive layer includes a Ni conductive layer on the Cu conductive layer, and a Pd conductive layer on the Ni conductive layer.

14. The semiconductor device of claim 1, wherein the bonding member includes a columnar body extending in a thickness direction of the pad wiring layer.

15. The semiconductor device of claim 1, wherein the bonding member includes a bonding wire.

16. The semiconductor device of claim 1, further comprising:
a conductive member that supports the semiconductor chip; and
a sealing resin that covers a portion of the conductive member and the semiconductor chip.

* * * * *